(12) United States Patent
Birkbeck

(10) Patent No.: US 11,689,161 B2
(45) Date of Patent: *Jun. 27, 2023

(54) BIAS TECHNIQUES FOR AMPLIFIERS WITH MIXED POLARITY TRANSISTOR STACKS

(71) Applicant: pSemi Corporation, San Diego, CA (US)

(72) Inventor: John Birkbeck, New Milton (GB)

(73) Assignee: PSEMI CORPORATION, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/486,810

(22) Filed: Sep. 27, 2021

(65) Prior Publication Data

US 2022/0182017 A1 Jun. 9, 2022

Related U.S. Application Data

(63) Continuation of application No. 16/563,408, filed on Sep. 6, 2019, now Pat. No. 11,133,782.

(51) Int. Cl.
*H03F 1/22* (2006.01)
*H03F 3/45* (2006.01)
*H03F 3/193* (2006.01)

(52) U.S. Cl.
CPC .............. *H03F 1/223* (2013.01); *H03F 3/193* (2013.01); *H03F 3/45071* (2013.01); *H03F 2200/21* (2013.01)

(58) Field of Classification Search
CPC ...... H03F 1/223; H03F 3/193; H03F 3/45071; H03F 2200/21; H03F 2200/61; H03F 1/0272; H03F 3/45475; H03F 2203/30009; H03F 2203/30084; H03F 2203/30117; H03F 1/301; H03F 1/308; H03F 3/3028
USPC .................................... 330/311, 267; 33/273
See application file for complete search history.

(56) References Cited

U.S. PATENT DOCUMENTS 8,497,736 B1 * 7/2013 Leipold ................. H03F 3/3022
330/267

* cited by examiner

*Primary Examiner* — Hieu P Nguyen
(74) *Attorney, Agent, or Firm* — Steinfl + Bruno LLP

(57) ABSTRACT

Various methods and circuital arrangements for biasing gates of stacked transistor amplifier that includes two series connected transistor stacks of different polarities are presented, where the amplifier is configured to operate according to different modes of operation. Such circuital arrangements operate in a closed loop with a feedback error voltage that is based on a sensed voltage at a common node of the two series connected transistor stacks. According to one aspect, gate biasing voltages to input transistors of each of the two series connected stacks are adjusted by respective current mirrors that are controlled based on the feedback error voltage. According to another aspect, other gate biasing voltages are generated by maintaining a fixed gate biasing voltage between any two consecutive gate basing voltages.

24 Claims, 13 Drawing Sheets

BIAS TECHNIQUES FOR AMPLIFIERS WITH MIXED POLARITY TRANSISTOR STACKS

CROSS REFERENCE TO RELATED APPLICATIONS

The present application is a continuation of U.S. Non-provisional patent application Ser. No. 16/563,408, filed Sep. 6, 2019, for "Bias Techniques for Amplifiers With Mixed Polarity Transistor Stacks", which is herein incorporated by reference in its entirety. The present application is also related to U.S. Non-provisional patent application Ser. No. 16/563,481 entitled "Bias Techniques for Controlled Voltage Distribution in Stacked Transistor Amplifiers" filed Sep. 6, 2019, the disclosure of which is incorporated herein by reference in its entirety. The present application is also related to U.S. Pat. No. 10,250,199 B2 entitled "Cascode Amplifier Bias Circuits" issued Apr. 2, 2019, the disclosure of which is incorporated herein by reference in its entirety.

TECHNICAL FIELD

The present application relates to amplifiers. In particular, the present application relates to gate biasing for amplifiers comprising two series connected transistor stacks, wherein each transistor stacks consists of transistors of a different polarity.

BACKGROUND

In recent years, stacked cascode amplifiers, which use a plurality of transistors of a same polarity (i.e., type) arranged as a stack (stacked transistors) in an amplification stage of the amplifiers, have become predominant in radio frequency (RF) applications where high power, high voltage outputs are desired. Due to the higher number of transistors in the stack, voltage handling performance of the amplifier is increased, thereby allowing the high power, high voltage outputs. Since the stacked transistors comprise individual low voltage transistors which can tolerate a voltage substantially lower than the output voltage of the amplifier, it is important to bias the low voltage transistors of the stack to maintain operation within their tolerable voltage ranges. In cases where the amplifier can operate according to different modes of operation, such as for example an idle/standby mode and an active (amplification) mode, voltage compliance of the low voltage transistors of the stack must be maintained during each of the modes of operation. For stacks having transistors of a same polarity, as shown in FIGS. 2B and 2C later described, control of the mode of operation between for example the idle/standby mode and the active mode may be provided by i) increasing or decreasing a gate biasing voltage to an input transistor of the stack by a voltage amount to effectively control a different bias current through the stack, and ii) increasing or decreasing gate biasing voltages of remaining transistors of the stack by the same voltage amount to maintain operation of all the transistors of the stack within their tolerable voltage ranges.

With the advent of newer semiconductor technologies, radio frequency (RF) performance gap between transistors of different polarities (e.g., N-type, P-type) has shrunk to a point that RF amplifiers having (series connected) transistor stacks of mixed polarities can be realized with performances that can match or even surpass, in some respect, performances of RF amplifiers with same/single polarity stacks. Some benefits of such RF amplifiers with mixed polarity transistor stacks can include, for example, push-pull topologies with increased linearity performance and increased noise figure performance which are well suited for use as amplifiers in transmit and/or receive paths of RF systems. Because such RF amplifiers include stacks of different polarities, as shown in FIGS. 3B and 3C later described, biasing of such stacks for operation of the RF amplifier according to different modes (e.g., standby, active) may include i) increasing a gate biasing voltage of an input transistor of a first polarity (e.g., N-type) stack by a voltage amount to control a bias current through the first polarity stack while decreasing a gate biasing voltage of an input transistor of a second polarity (e.g., P-type) stack by a similar voltage amount to control the same bias current through the second polarity stack, and ii) increasing gate biasing voltages of remaining transistors of the first polarity stack and decreasing gate biasing voltages of remaining transistors of the second polarity stack to maintain operation of all transistors of the first and second polarity stacks within their tolerable voltage ranges. However, because the different polarity transistors may have different I-V (current-voltage) characteristics, based on the gate biasing voltages and a supply voltage across the series connected stacks, such transistors may settle at different biasing conditions (e.g., different drain-to-source voltages) which in turn may shift a voltage at a common node (e.g., $V_{CN}$ of FIGS. 3B, 3C) of the two stacks. Such shift may in turn affect voltage compliance of one of the two transistors coupled to the common node and potentially result in malfunction and/or damaging of the one transistor. Furthermore, a similar effect of a shift of the voltage at the common node of the two stacks may be obtained due to different PVT (process, voltage and temperature variations) characteristics of the different polarities transistors of the two stacks. Teachings according to the present disclosure address such biasing effects in RF amplifiers having stacks of different polarities.

SUMMARY

The various teachings according to the present disclosure describe biasing techniques and circuits for providing biasing voltages of two series connected transistor stacks of different polarities operating as a radio frequency (RF) amplifier in a controlled manner to maintain voltage compliance of each of the stacked transistors for safe operation during the various modes of operation of the amplifier.

According to a first aspect of the present disclosure, a circuital arrangement is presented, the circuital arrangement comprising: a stacked transistor amplifier comprising a N-type transistor stack in series connection with a P-type transistor stack, each of the N-type transistor stack and the P-type transistor stack comprising a plurality of stacked transistors comprising an input transistor and one or more cascode transistors comprising an output transistor; the stacked transistor amplifier configured to operate between a first supply voltage coupled to the input transistor of the P-type transistor stack, and a reference ground coupled to the input transistor of the N-type transistor stack, wherein the series connection is provided at a common node that couples the output transistor of the N-type transistor stack to the output transistor of the P-type transistor stack; a gate biasing circuit coupled to gates of the plurality of stacked transistors of the N-type transistor stack and the P-type transistor stack to provide respective gate biasing voltages, a feedback loop that is configured to use a voltage at the common node to generate an error voltage that is provided to the gate biasing circuit, wherein the gate biasing circuit comprises a N-type current mirror and a P-type current mirror whose outputs are respectively coupled to a gate of the input transistor of the N-type stack and to a gate of the input transistor of the P-type stack, and wherein the gate biasing circuit is configured to control a difference between respective currents output by the N-type and P-type current mirrors based on the error voltage to adjust the respective gate biasing voltages.

According to a second aspect of the present disclosure, a method for biasing a stacked transistor amplifier comprising an N-type transistor stack in series connection with a P-type transistor stack is presented, the method comprising: sensing a voltage at a common node used for the series connection; based on the sensing, generating an error voltage in a closed loop circuit; based on the generating, controlling a difference between currents output by a N-type current source and a P-type current source respectively coupled to a gate of an input transistor of the N-type transistor stack and an input transistor of the P-type transistor stack; and based on the controlling, adjusting gate biasing voltages to said input transistors.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
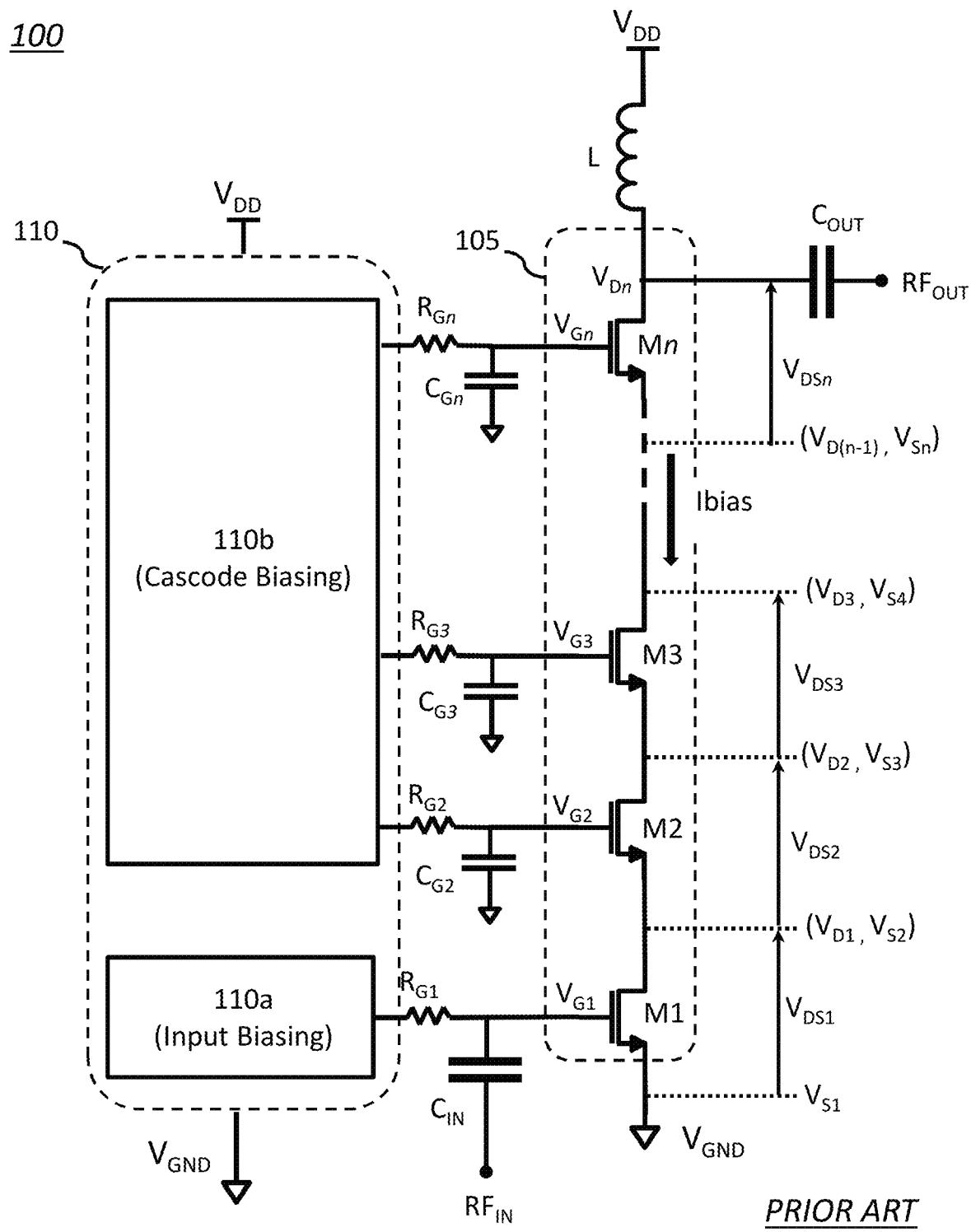
FIG. 1 shows a prior art configuration of a stacked transistor amplifier comprising a transistor stack having a plurality of transistors of a same polarity, wherein a biasing circuit is used to bias each of the input transistor and the cascode transistors of the stack.

FIG. 1 shows a simplified schematic of a prior art stacked cascode (RF) amplifier (105) that is DC biased by a biasing (circuital arrangement) circuit (110) for providing gate biasing voltages to gates of FET transistors (M1, M2, ..., Mn). As shown in FIG. 1, some prior art configurations may partition the biasing circuit (110) in two biasing circuits, including an input biasing circuit (110a) for providing a gate biasing voltage, $V_{G1}$, of an input transistor M1 of the amplifier (105), and a cascode biasing circuit (110b) for providing gate biasing voltages ($V_{G2}, \ldots, V_{Gn}$) of cascode transistors (M2, . . . , Mn) of the amplifier (105).

The stacked cascode amplifier (105) shown in FIG. 1 can comprise a stack of FET transistors (M1, M2, . . . , Mn) that include an input transistor M1 and cascode transistors (M2, . . . , Mn), including cascode output transistor Mn. An input RF signal, $RF_{IN}$, is coupled to a gate $V_{G1}$ of the input transistor, M1, and is amplified by the amplifier (105). A corresponding amplified output RF signal, $RF_{OUT}$, is output at a drain of the output transistor Mn. Bypass capacitors ($C_{IN}$, $C_{OUT}$) can be used to decouple low frequency (e.g., DC) biasing voltages provided to the stack of transistors (transistor stack) from the $RF_{IN}$ and $RF_{OUT}$ signals. A supply voltage $V_{DD}$ is coupled to the drain of the output transistor Mn through an inductor L, and a reference ground $V_{GND}$ (e.g., GND or AC ground) is coupled to a source of the input transistor M1. A number n of the stacked transistors may be any integer number larger than or equal to two, and may be a function of a level of the supply voltage and tolerable voltage (e.g., handling voltage) ranges of the transistors (M1, M2, . . . , Mn).

With continued reference to the prior art configuration shown in FIG. 1, gate capacitors ($C_{G2}, \ldots, C_{GN}$) coupled between respective gates of the cascode transistors (M2, . . . , Mn) and the reference ground $V_{GND}$ may be used to further protect the transistors of the stack from added stress caused by RF voltage components during amplification of an RF signal. Accordingly, the value of each of the gate capacitors ($C_{G2}, \ldots, C_{GN}$) may be chosen to allow each of the gate biasing voltages ($V_{G2}, \ldots, V_{GN}$) to vary along (float) with the RF signal at a drain of a respective cascode transistor (M2, . . . , Mn), which consequently allows control of a voltage drop (e.g., $V_{DS}$) across the transistor. In addition, series gate resistors ($R_{G1}, R_{G2}, \ldots, R_{Gn}$) may be used to decouple an RF signal at the gates of the transistors (M1, M2, . . . , Mn) from the biasing circuit (110), and therefore ensure that the RF signal has a reduced effect on the biasing circuit.

Figure 2A:
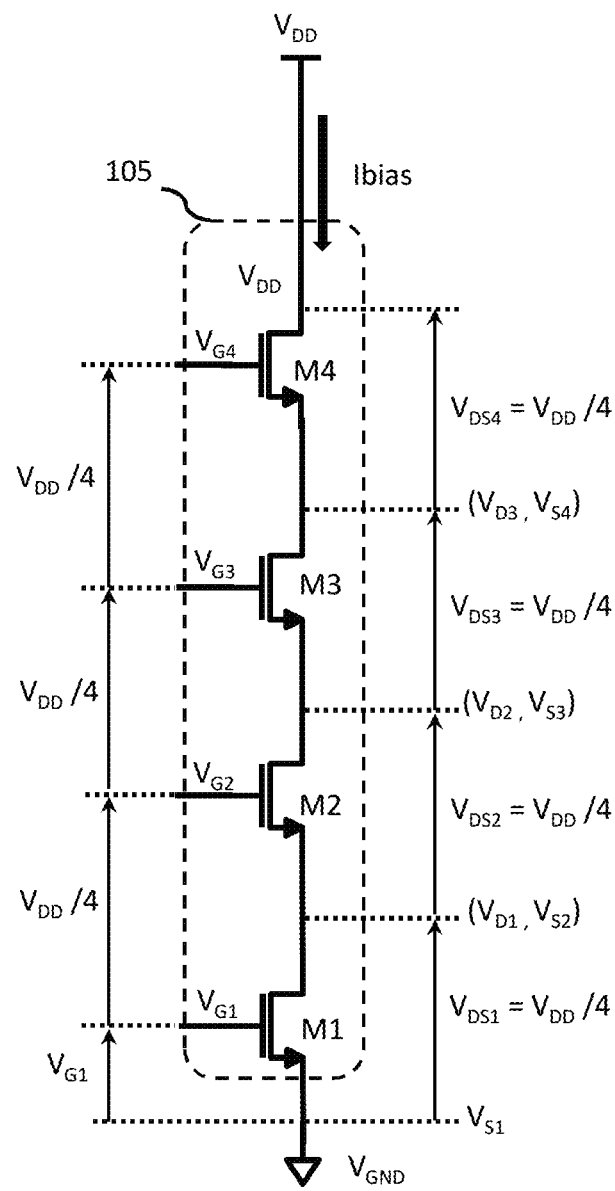
FIG. 2A shows a DC biasing configuration of the prior art configuration of FIG. 1 for an exemplary distribution of a supply voltage to the stack across the plurality of transistors of the same polarity.

With further reference to the prior art configuration of FIG. 1, the gate biasing voltages ($V_{G2}, V_{G3}, \ldots, V_{Gn}$) generated by the biasing circuit (110b) are such that each transistor (M1, M2, . . . , Mn) of the stack is (DC) biased according to a voltage compliance of the transistor. In other words, a voltage across any two terminals (e.g., gate, source, drain) of the transistor is within a safe operating range of the transistor. As clearly understood by a person skilled in the art, the gate biasing voltages ($V_{G2}, V_{G3}, \ldots, V_{Gn}$) generated by the biasing circuit (110b) distribute the supply voltage $V_{DD}$, which is coupled to the drain of the output transistor Mn through the inductor L, across the drain-to-source voltages ($V_{DS1}, V_{DS2}, \ldots, V_{DSn}$) of the transistors (M1, M2, . . . , Mn). Such distribution of the supply voltage may be in view of enabling a flow of a bias current, Ibias, through the transistor stack that is established via the gate biasing voltage $V_{G1}$ to the input transistor M1 generated by the input biasing circuit (110a). For example, as shown in FIG. 2A, a desired value of the (DC) current Ibias that corresponds to a desired gain of the amplifier (105) together with a desired distribution (e.g., division) of the supply voltage $V_{DD}$ across the drain-to-source voltages ($V_{DS1}, V_{DS2}, \ldots, V_{DSn}$) of the transistors (M1, M2, . . . , Mn) may first be established, followed by generating via the (input) biasing circuit (110a) the gate biasing voltage $V_{G1}$ that provides the current Ibias, and generating via the (cascode) biasing circuit (110b) the gate biasing voltages ($V_{G2}, V_{G3}, \ldots, V_{Gn}$) that respectively control the drain voltages ($V_{D1}, V_{D2}, \ldots, V_{D(n-1)}$) such as to obtain the desired distribution of the supply voltage $V_{DD}$. It should be noted that as used herein, the expressions "distribute the supply voltage across the transistors", "distribute the supply voltage across the stack", and "distribute the supply voltage across the drain-to-source voltages of the transistors" are equivalent, wherein the distribution can be an equal distribution (i.e., even distribution) as shown in FIG. 2A, or an unequal distribution (i.e., uneven distribution).

FIG. 2A shows a DC biasing configuration of the prior art configuration of FIG. 1 for an exemplary distribution of a supply voltage $V_{DD}$ to the stack across the plurality of transistors (M1, M2, . . . , Mn) of the same polarity. As can be seen in FIG. 2A, the distribution of the supply voltage $V_{DD}$ may be obtained by maintaining a gate biasing voltage separation, $V_{G(k+1)} - V_{Gk}$, between any two consecutive gate biasing voltages ($V_{G1}, V_{G2}, \ldots, V_{Gn}$) that corresponds to the desired distribution. For example, as shown in FIG. 2A, for an even distribution, such gate biasing voltage separation may be $V_{DD}/n$, wherein n is the number of transistors (M1, M2, . . . , Mn) of the stack, and equal to four in the prior art configuration of FIG. 2A. It should be noted that the exemplary prior art configuration of FIG. 2A is shown including same polarity transistors that are N-type FET transistors. As used in the present disclosure, polarity of a transistor is uniquely defined by the type of transistor as understood by a person skilled in the art, such as, for example, N-type or P-type for the case of FET transistors, and n-p-n or p-n-p types for bipolar transistors. In other words, the terms "polarity" and "type" as related to a transistor are interchangeable in the present disclosure. As used herein the expressions "N-type stack", "N-type transistor stack" are equivalent and refer to a stack of a plurality of series connected N-type transistors that operate as a cascode amplifier. As used herein the expressions "P-type stack", "P-type transistor stack" are equivalent and refer to a stack of a plurality of series connected P-type transistors that operate as a cascode amplifier.

A person skilled in the art readily knows that an RF amplifier, such as the prior art amplifier (105) of FIG. 1, may operate according to different modes of operations that may require different gate biasing voltages. Such different modes of operation may include modes associated to, for example, different amplification gains, or simply an active mode wherein an RF signal is amplified and a standby mode (e.g., inactive mode, idle mode) wherein no amplification occurs and currents through the stack (i.e., Ibias) and other related circuits may be minimized for energy saving purposes. Accordingly, as shown in FIGS. 2B and 2C, switching between two different modes of operation may be provided by i) increasing or decreasing a gate biasing $V_{G1}$ voltage to an input transistor M1 of the stack by a voltage amount to effectively control a different bias current through the stack, and ii) increasing or decreasing gate biasing voltages ($V_{G2}, \ldots, V_{Gn}$) of remaining transistors (M2, . . . , Mn) of the stack by the same voltage amount to maintain a desired gate biasing voltage separation and therefore operation of all the transistors of the stack within their tolerable voltage ranges.

Figure 2B:
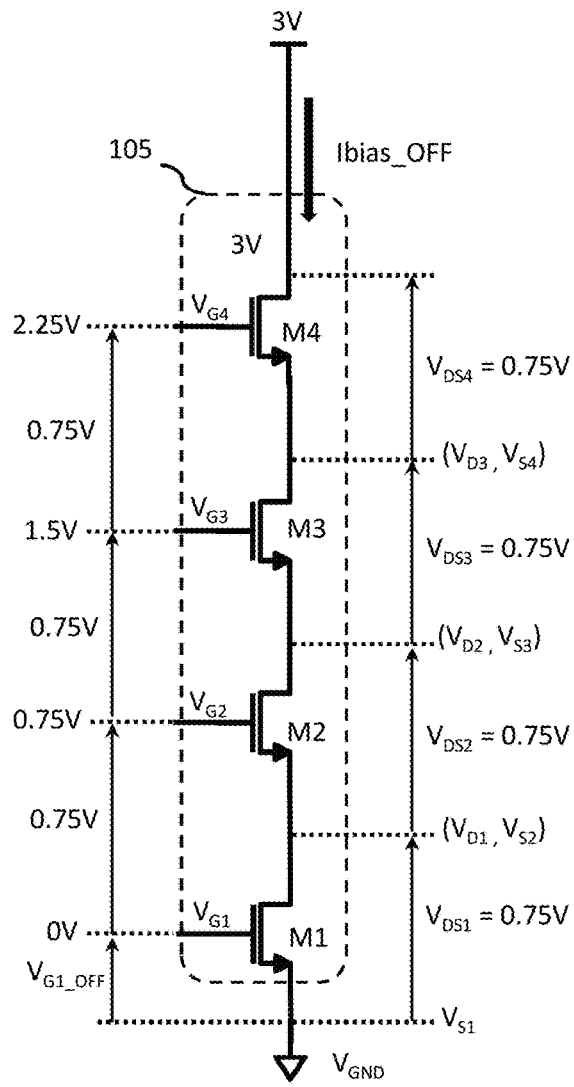
FIG. 2B shows exemplary DC biasing voltages of the prior art configuration of FIG. 1 for a standby mode of operation, wherein a gate biasing voltage to an input transistor of the transistor stack provides a zero current through the transistor stack.

FIG. 2B shows exemplary DC biasing voltages of the prior art configuration of FIG. 1 for a standby mode of operation, wherein a gate biasing voltage $V_{G1}$ to the input transistor M1 of the transistor stack provides a zero current, Ibias_OFF, through the transistor stack. Because the input transistor M1 is in a common-source configuration (source node $V_{S1}$ coupled to $V_{GND}$), turning off current through the input transistor can be provided by setting the gate biasing voltage $V_{G1}$ to the input transistor M1 to 0 volts as shown in FIG. 2B. Furthermore, as shown in FIG. 2B, even distribution of the supply voltage $V_{DD}$ across the transistors (M1, M2, M3, M4) of the stack can be obtained by setting the gate biasing voltages ($V_{G2}$, $V_{G3}$, $V_{G4}$) of the remaining transistors (M2, M3, M4) of the stack to maintain a gate biasing voltage separation of $V_{DD}/4=3/4=0.75$ volts that corresponds to the even distribution. Accordingly, as shown in FIG. 2B, drain-to-source voltages $V_{DS1}$, $V_{DS2}$, $V_{DS3}$, $V_{DS4}$ equally divide/distribute the supply voltage $V_{DD}$.

Figure 2C:
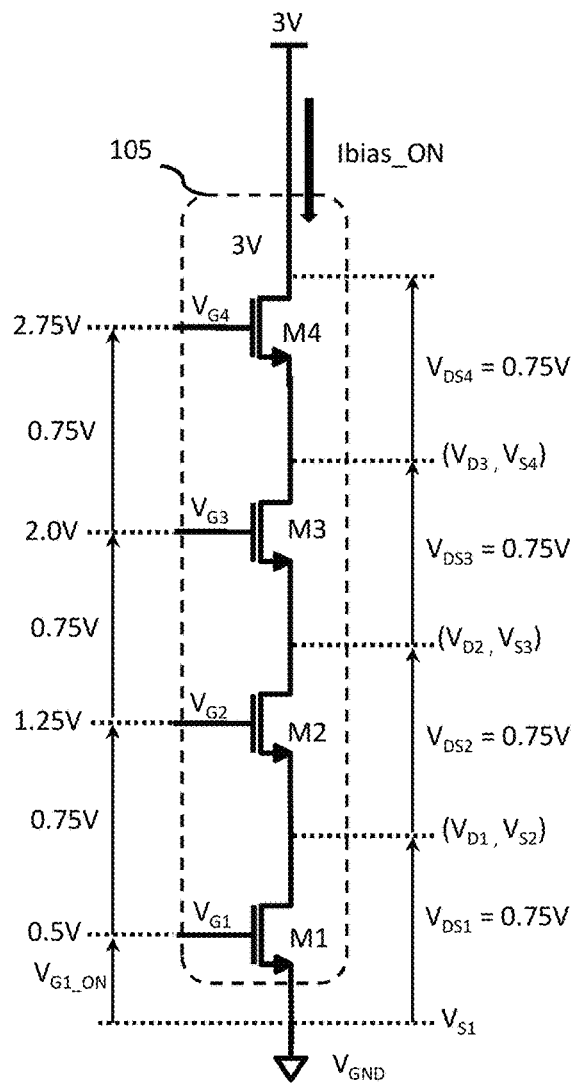
FIG. 2C shows exemplary DC biasing voltages of the prior art configuration of FIG. 1 for an active mode of operation, wherein a gate biasing voltage to the input transistor of the transistor stack provides a non-zero current through the transistor stack.

FIG. 2C shows exemplary DC biasing voltages of the prior art configuration of FIG. 1 for an active mode of operation, wherein the gate biasing voltage $V_{G1}$ to the input transistor M1 of the transistor stack provides a non-zero current, Ibias_ON through the transistor stack. When compared to the biasing configuration for operation in the standby mode per FIG. 2B, switching from the standby mode to the active mode can be obtained by i) increasing the gate biasing voltage $V_{G1}$ by 0.5V (in this example) to the input transistor M1 to provide flow of the Ibias_on current through the stack, and ii) increasing gate biasing voltages ($V_{G2}$, $V_{G3}$, $V_{G4}$) of the remaining transistors (M2, M3, M4) of the stack to maintain the gate biasing voltage separation of $V_{DD}/4=3/4=0.75$ volts that corresponds to the even distribution. Accordingly, as shown in FIG. 2C, drain-to-source voltages $V_{DS1}$, $V_{DS2}$, $V_{DS3}$, $V_{DS4}$ maintain the equal division/distribution of the supply voltage $V_{DD}$ across the stack of transistors (M1, M2, M3, M4).

Because a stack of a plurality of transistors of a same polarity is used in the prior art amplifier described above with reference to FIGS. 1, 2A, 2B and 2C, by offsetting gate biasing voltages of the cascode transistors (M2, . . . , Mn) according to a same offset voltage (amplitude and polarity) used for the input gate biasing voltage $V_{G1}$ to switch between modes of operation, distribution of the supply voltage $V_{DD}$ across the transistors (M1, M2, . . . , Mn) of the stack, and therefore voltage compliance of such transistors, can be maintained. As will be described below, in a case wherein the amplifier includes series connected stacks of different polarities, mode switching of the amplifier may include offsetting gate biasing voltages of transistors of different polarities with offset voltages that may be of opposite polarities (e.g., increasing gate biasing voltages of transistors of one polarity and decreasing gate biasing voltages of transistors of the other polarity).

Figure 3A:
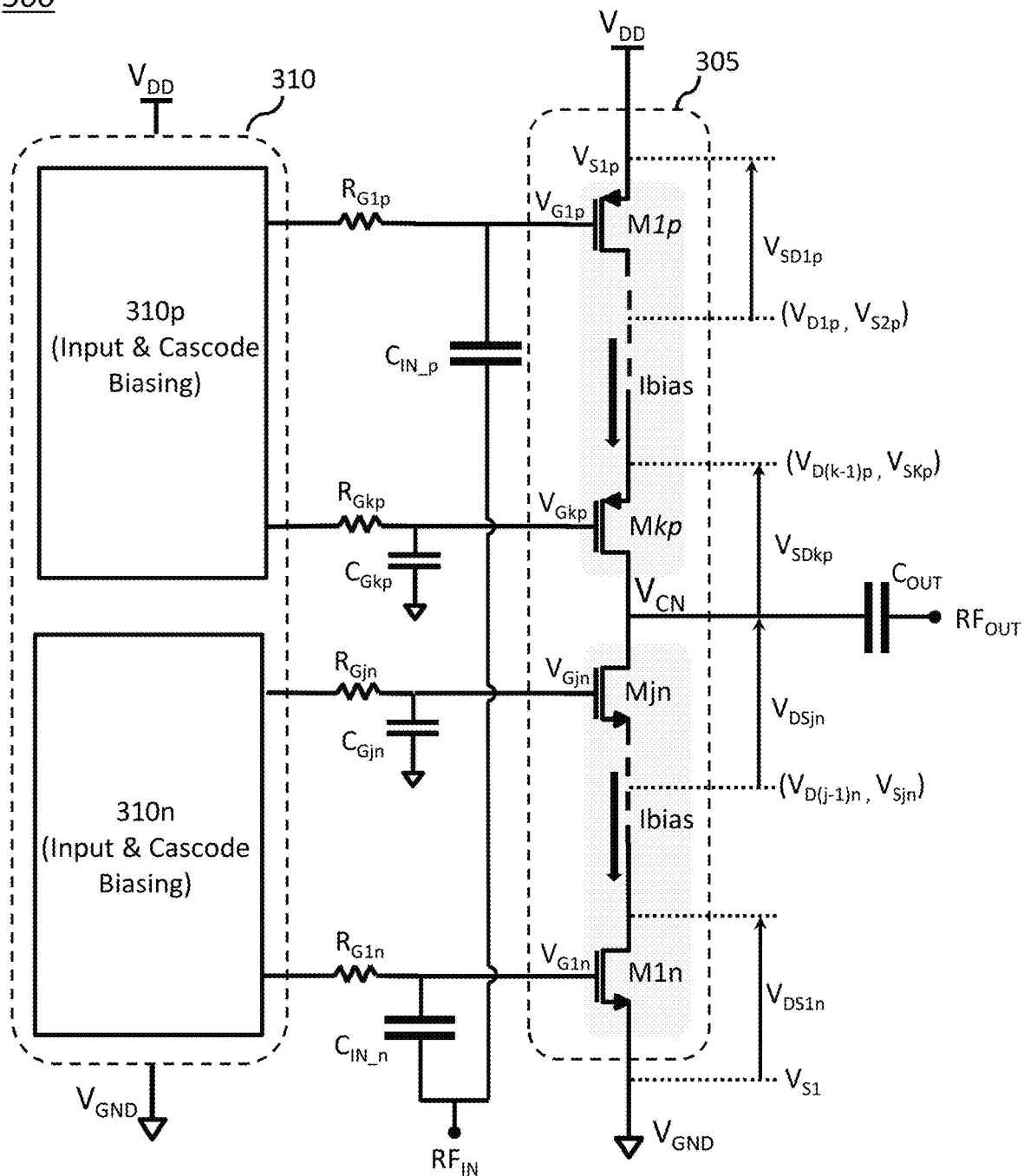
FIG. 3A shows a stacked transistor amplifier comprising two series connected transistor stacks of different polarities, wherein respective biasing circuits are used to bias each of the two series connected transistor stacks.

FIG. 3A shows a stacked transistor amplifier (305) comprising two series connected transistor stacks of different polarities, (M1n, . . . , Mjn) and (M1p, . . . , Mkp), wherein respective biasing circuits (310n) and (310p), are used to bias each of the two series connected transistor stacks. In the exemplary configuration shown in FIG. 3A, the amplifier (305) includes a stack (M1n, . . . , Mjn) that includes a plurality j of N-type FET transistors that is in series connection with a stack (M1p, . . . , Mkp) that includes a plurality k of P-type FET transistors. Series connection of the two stacks is provided via a common node, $V_{CN}$, that is coupled to i) a drain node of a N-type output (cascode) transistor Mjn of the N-type stack (M1n, . . . , Mjn), and ii) to a drain node of a P-type output (cascode) transistor Mkp of the P-type stack (M1p, . . . , Mkp). A supply voltage $V_{DD}$ is directly coupled a source node of a P-type input transistor M1p of the P-type stack (M1p, . . . , Mkp) and a reference ground $V_{GND}$ (e.g., GND or AC ground) is coupled to a source node of a N-type input transistor M1n of the N-type stack (M1n, . . . , Mjn). A respective number j and k of the stacked transistors (M1n, . . . , Mjn) and (M1p, . . . , Mkp) may be any integer number larger than or equal to two, and the sum j+k may be a function of a level of the supply voltage $V_{DD}$ and tolerable voltage (e.g., handling voltage) ranges of each of the transistors (M1n, Mjn, Mkp, M1p) of the amplifier (305).

With continued reference to FIG. 3A, a person skilled in the art knows that each of the stacks (M1n, Mjn) and (M1p, Mkp) operates according to a cascode configuration similar to one described with reference to FIG. 1, including respective input transistors M1n and M1p, and respective cascode transistors, (M2n, Mjn) and (M2p, Mkp) including respective output cascode transistors Mjn and Mkp. As shown in FIG. 3A, an input RF signal, $RF_{IN}$, is coupled to gates $V_{G1n}$ and $V_{G1p}$ of respective input transistors M1n and M1p of the two stacks, and is amplified according to a well-known in the art push-pull configuration by each of the series connected transistor stacks (M1n, . . . , Mjn) and (M1p, Mkp) of the amplifier (305). A corresponding amplified output RF signal, $RF_{OUT}$, is output at the common node $V_{CN}$ that is coupled to drain nodes of the output transistors Mjn and Mkp. Bypass capacitors ($C_{IN\_n}$, $C_{IN\_p}$, $C_{OUT}$) can be used to decouple low frequency (e.g., DC) biasing voltages provided to the stacked transistor amplifier (305) from the $RF_{IN}$ and $RF_{OUT}$ signals.

With further reference to FIG. 3A, a person skilled in the art would understand that a current through each of the N-type and P-type stacks may be defined by biasing of a corresponding input transistor, M1n and M1p, and a level of the supply voltage $V_{DD}$. Furthermore, like the biasing of the single stack configuration described above with reference to FIGS. 1, 2A, 2B and 2C, gate biasing voltages ($V_{G2n}$, $V_{Gjn}$) and ($V_{G2p}$, $V_{Gkp}$) to respective cascode transistors of each of the N-type and P-type stacks may establish a desired distribution of the supply voltage $V_{DD}$ across the transistors of the stacked amplifier (305). In particular, as it would be clear to a person skilled in the art, the gate biasing voltages to the cascode transistors of each of the two stacks, in combination with respective I-V characteristics of the transistors, set the biasing conditions of the transistors to support the bias current Ibias. In other words, the gate biasing voltages ($V_{G2n}$, $V_{Gjn}$) and ($V_{G2p}$, $V_{Gkp}$) in combination with the respective I-V characteristics establish source voltages ($VS_{S2n}$, $V_{Sjn}$) and ($V_{S2p}$, $V_{Skp}$) of the cascode transistors (M2n, Mjn) and (M2p, Mkp), and therefore drain-to-source ($V_{DS1n}$, $V_{DSjn}$) and ($V_{DS1p}$, $V_{DSkp}$) of each of the two stacks.

With continued reference to FIG. 3A, because the two N-type and P-type stacks are in series connection, as shown in FIG. 3A, a same biasing current, Ibias, must flow through both stacks. It follows that any mismatch in I-V characteristics (e.g., PVT characteristics) of the N-type transistors with respect to the P-type transistors may provide different biasing conditions of the transistors to support the flow of the current Ibias. Since the drain nodes of the output transistors Mkp and Mjn are not coupled to any reference DC voltage, the common node $V_{CN}$ may be free to settle/drift in view of the different biasing conditions, which in turn may affect voltage compliance of one of the two output transistors Mkp and Mjn. Teachings according to the present disclosure dynamically adjust gate biasing voltage to one or both of the input transistors M1n and M1p so to maintain the (DC) voltage at node $V_{CN}$ constant and at a desired level.

Figure 3B:
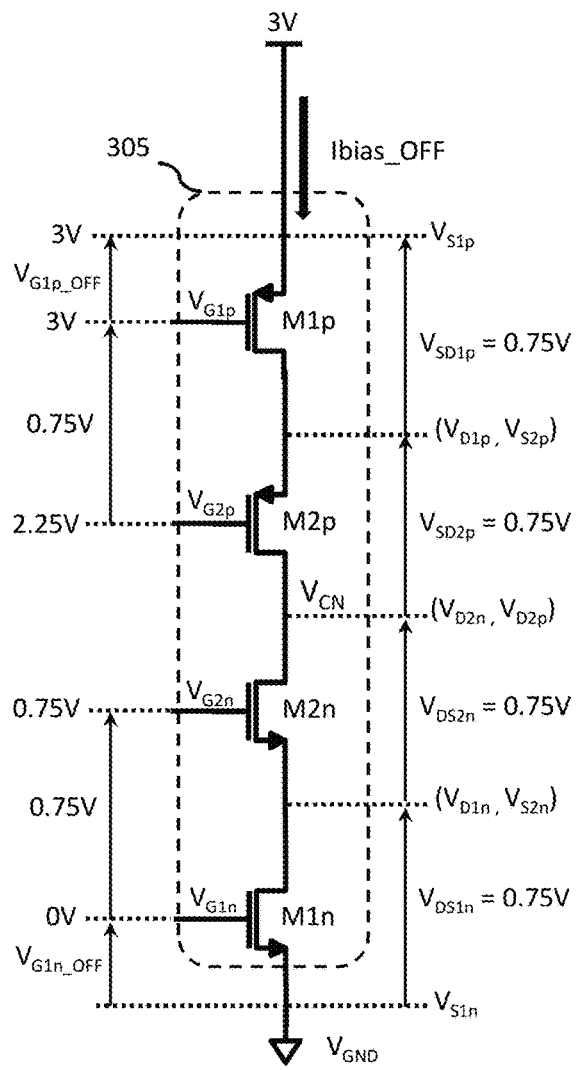
FIG. 3B shows exemplary DC biasing voltages of the configuration of FIG. 3A for a standby mode of operation, wherein gate biasing voltages to respective input transistors of the transistor stacks of different polarities provide a zero current through said stacks.
Figure 4:
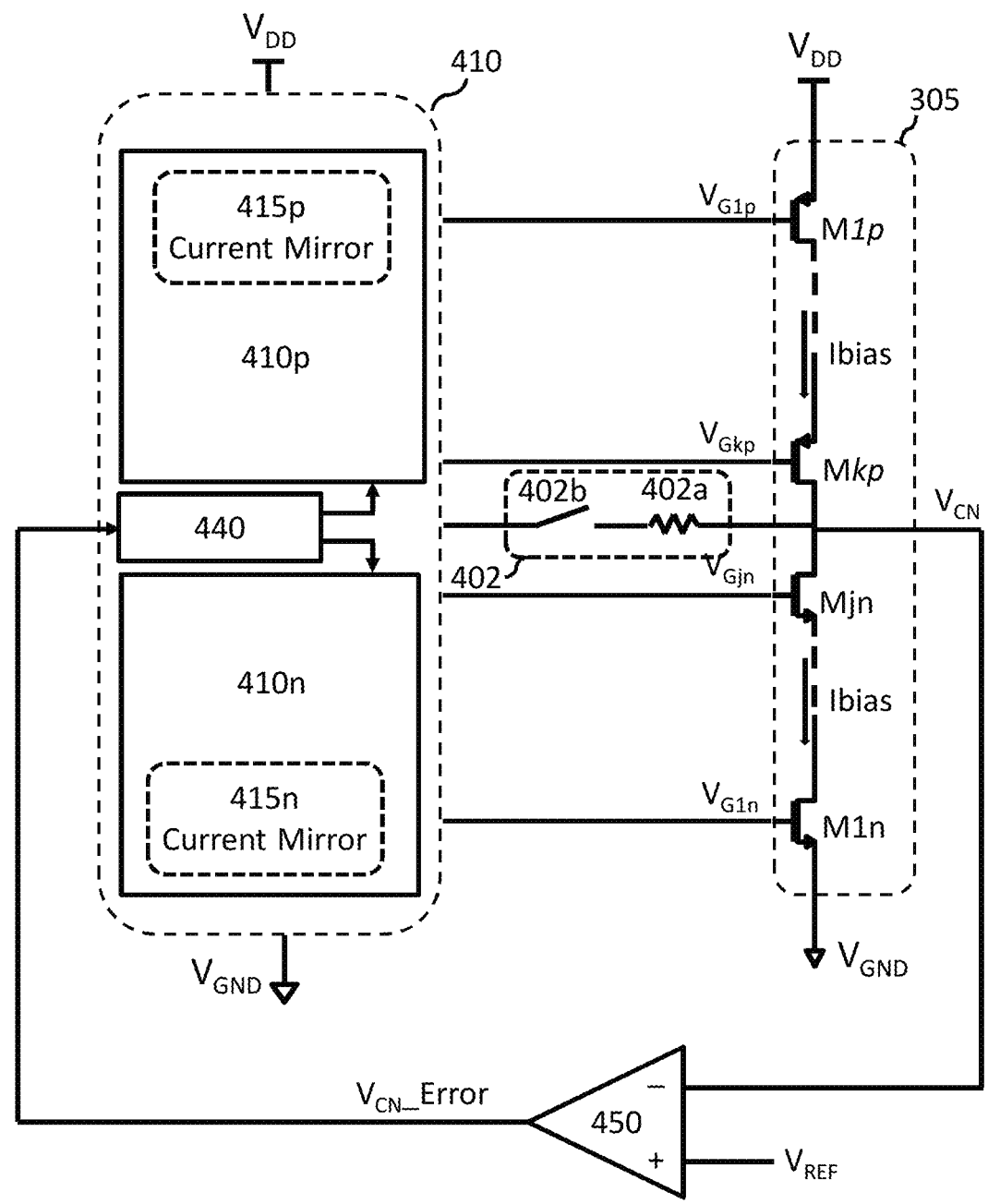
FIG. 4 shows an embodiment according to the present disclosure of a block diagram of a biasing circuit for a stacked transistor amplifier comprising two series connected transistor stacks of different polarities, wherein biasing of each of the two series connected transistor stacks may include a respective current mirror that is controlled in a closed loop based on a voltage that is sensed at a common node of the two series connected transistor stacks. RF connections and associated components are not shown on this diagram to aid clarity.

FIG. 3B shows exemplary DC biasing voltages of the configuration of FIG. 3A, with j=k=2, for a standby mode of operation, wherein gate biasing voltages $V_{G1n}$ and $V_{G1p}$ to respective input transistors M1n and M1p of the N-type transistor stack (M1n, . . . , Mjn) and the P-type transistor (M1p, . . . , Mkp) provide a zero current, Ibias_OFF, through said stacks. In this case, $V_{G1n}$ and $V_{G1p}$ are respectively set to 0 volts and 3 volts so to turn off the respective N-type and P-type input transistors by setting corresponding gate-to-source voltages to 0 volts. Similar to the prior art configuration described above, gate biasing voltages to the respective cascode transistors M2p and M2n provide a gate biasing voltage separation corresponding to a desired distribution of the supply voltage across the transistors of each of the two stacks. In particular, for a supply voltage of 3 volts, and for an equal distribution of the supply voltage across all of the transistors combined, a gate biasing voltage separation equal to $V_{DD}/(j+k)=3/4=0.75$ volts may be provided. It should be noted that depending on the breakdown limits of M2n and M2p, the now floating $V_{CN}$ node may be connected to a supply voltage, such as for example a mid-rail voltage $V_{DD}/2=1.5$ volts supply, to force such voltage at the $V_{CN}$ node and thereby protect the transistors M2n and M2p. As shown in FIG. 4 later described, according to an embodiment of the present disclosure, such voltage may be provided to the $V_{CN}$ node via a resistor (402a) that couples a voltage generated by a biasing circuit (410) to the $V_{CN}$ node. The value of the resistor (402a) can be made very high such that it can be left in place without affecting ON state performance of the amplifier (e.g., 305). according to an alternative embodiment of the present disclosure, the resistor (402a) can be part of a switching circuit (402) that selectively couples such voltage to the $V_{CN}$ node via a switch (402b), such as for example a FET switch, during the standby mode of operation.

Figure 3C:
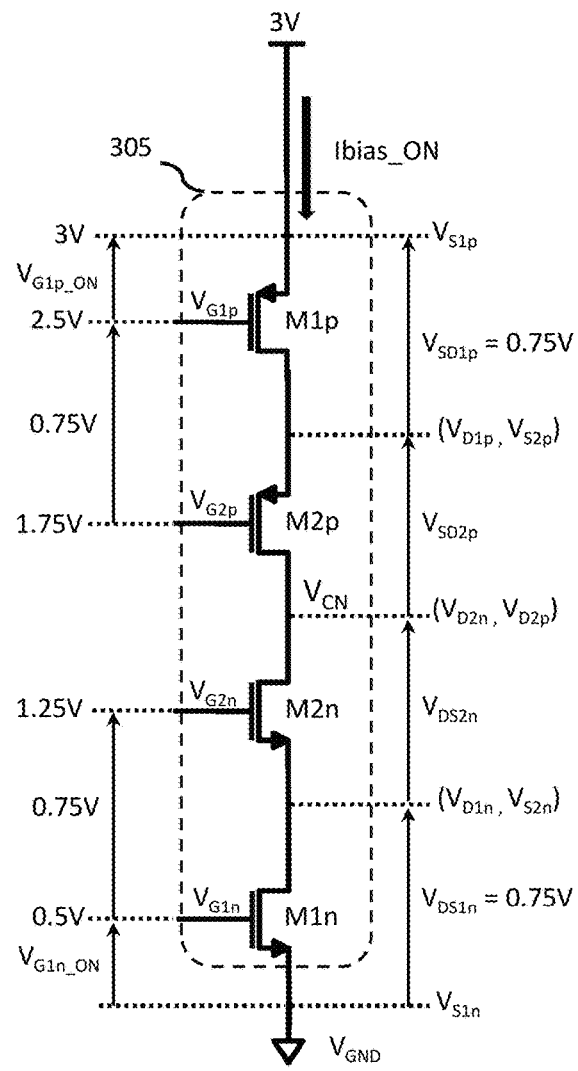
FIG. 3C shows exemplary DC biasing voltages of the configuration of FIG. 3A for an active mode of operation, wherein gate biasing voltages to respective input transistors of the transistor stacks of different polarities provide a non-zero current through said stacks.

FIG. 3C shows exemplary DC biasing voltages of the configuration of FIG. 3A, with j=k=2, for an active mode of operation, wherein gate biasing voltages $V_{G1n}$ and $V_{G1p}$ to respective input transistors M1n and M1p of the N-type transistor stack (M1n, . . . , Mjn) and the P-type transistor (M1p, . . . , Mkp) provide a non-zero current, Ibias_on, through said stacks. In this case, $V_{G1n}$ and $V_{G1p}$ are respectively set to 0.5 volts and 2.5 volts so to turn on the respective N-type and P-type input transistors by setting corresponding gate-to-source voltages to 0.5 volts. Similar to the prior art configuration described above, gate biasing voltages to the respective cascode transistors M2p and M2n provide a gate biasing voltage separation corresponding to a desired distribution of the supply voltage across the transistors of each of the two stacks. In particular, when comparing to the standby mode of operation shown in FIG. 3B, the gate biasing voltage $V_{G2n}$ to the N-type cascode transistor M2n is increased by 0.5 volts, which is a same amount by which the gate biasing voltage $V_{G1n}$ of the input N-type transistor M1n is increased for switching to the active mode of operation. Similarly, the gate biasing voltage $V_{G2p}$ to the P-type cascode transistor M2p is decreased by 0.5 volts, which is a same amount by which the gate biasing voltage $V_{G1p}$ of the input P-type transistor M1p is decreased for switching to the active mode of operation. However, as described above, since the common node $V_{CN}$ is free to settle/drift in view of different biasing conditions of the different types transistors, drain-to-source voltages $V_{DS2n}$ and $V_{DS2p}$ ($=-V_{SD2p}$) may not be a priori known, and may be different.

FIG. 4 shows an embodiment according to the present disclosure of a block diagram of a biasing circuit (410) for a stacked transistor amplifier (305) comprising two series connected transistor stacks (M1n, . . . , Mjn) and (M1p, . . . , Mkp) of different polarities, wherein biasing of each of the two series connected transistor stacks may include a respective current mirror (415n) and (415p) that is controlled in a closed loop based on a voltage that is sensed at the common node $V_{CN}$ of the two series connected transistor stacks. Accordingly, such closed loop control allows dynamic (real time) adjustment of the gate biasing voltages generated by the biasing circuit (410) so to stabilize a voltage at the common node $V_{CN}$.

With continued reference to FIG. 4, according to an embodiment of the present disclosure, stabilizing of the voltage at the common node $V_{CN}$ can be provided by comparing such voltage to a reference voltage, Vref, via an amplifier (e.g., operational amplifier 450), and providing an error voltage, $V_{CN\_ERROR}$, that is proportional to a difference between the voltage and the common node $V_{CN}$ and the reference voltage Vref to the biasing circuit (410). Although not shown in FIG. 4, the $V_{CN}$ voltage may be filtered prior to application to the amplifier (450) to keep RF signals out of the bias circuit. A current demand distribution block (440) of the biasing circuit (410) may in turn use the error voltage, $V_{CN\_ERROR}$, to control a current asymmetry (i.e., current difference) between the current mirrors (415n) and (415p) to separately adjust the gate biasing voltages to each of the two N-type and P-type stacks so to minimize/null the error voltage $V_{CN\_ERROR}$.

According to some exemplary embodiments of the present disclosure, one or more of the two current mirrors (415n) and (415p) may be controlled to adjust the respective gate biasing voltages. In other words, according to one exemplary implementation, one of the two current mirrors may output a fixed current for corresponding fixed gate biasing voltages to one of the two stacks, and the other current mirror may output an adjusted current to adjust/control corresponding gate biasing voltages of the other stack. According to another embodiment, both current mirrors may output adjusted currents to adjust/control corresponding gate biasing voltages of both stacks.

With continued reference to FIG. 4, according to an embodiment of the present disclosure, the biasing circuit (410) includes two independent biasing circuit (410n) and (410p) for generation of gate biasing voltages to the respective N-type and P-type stacks. As can be seen in FIG. 4, the biasing circuit (410n) includes the current mirror (415n) and the biasing circuit (410p) includes the current mirror (415p). According to an embodiment of the present disclosure, the two biasing circuits (410n) and (410p) are symmetrical in design topology and include current sources and current mirrors that are complementary. In other words, if the biasing circuit (410n) includes a N-type current mirror, then the biasing circuit (410p) includes a P-type current mirror, and if the biasing circuit (410n) includes a current source that sources a current of a given magnitude, then the biasing circuit (410p) includes a similar current source that drains a current with the given magnitude. According to a further embodiment of the present disclosure, the current mirror (410n) is an N-type current mirror (formed by N-type transistors) and current mirror (410p) is a P-type current mirror (formed by P-type transistors). As used herein, the expression "N-type current mirror" refers to a current mirror whose reference and target transistors (e.g., Mi1n and Mi2n of FIG. 5A later described) are N-type. Similarly, as used herein, the expression "P-type current mirror" refers to a current mirror whose reference and target transistors (e.g., Mi1p and Mi2p of FIG. 5A later described) are P-type.

According to an embodiment of the present disclosure, a current output by each of the two current mirrors (415n) and (415p) directly controls a gate biasing voltage $V_{G1n}$ and $V_{G1p}$ of the respective N-type and P-type stacks. In other words, the error voltage, $V_{CN\_ERROR}$, is used to control a difference (i.e., asymmetry) of the currents output by the two current mirrors (415n) and (415p) to respectively control the gate biasing voltages $V_{G1n}$ and $V_{G1p}$ in a manner to maintain the voltage at the common node $V_{CN}$ equal to the reference voltage Vref. Such difference may be controlled by either maintaining one of the two output currents fixed and adjusting the other, or by adjusting both currents, based on the error voltage, $V_{CN\_ERROR}$. According to a further embodiment of the present disclosure, gate biasing voltages ($V_{G2n}$, $V_{Gjn}$) and ($V_{G2p}$, $V_{Gkp}$) to respective cascode transistors (M2n, Mjn) and (M2p, Mkp) of the N-type and P-type stacks are generated by offsetting the respectively controlled gate biasing voltages $V_{G1n}$ and $V_{G1p}$ by fixed voltages corresponding to a desired gate biasing voltage separation to maintain a desired distribution of the supply voltage across the transistors of the two stacks. In other words, for an exemplary case with equal distribution of the supply voltage across all of the transistors, the gate biasing voltages to the cascode transistors of the two stacks may be provided according to: $V_{G2n}=V_{G1n}$ Vs, $V_{G3n}=V_{G1n}$2Vs, $V_{Gjn}=V_{G1n}$(j−1)Vs, and $V_{G2p}=V_{G1p}$−VS, $V_{G3p}=V_{G1p}$−2Vs, $V_{Gkp}=V_{G1p}$−(k−1)Vs, where Vs=$V_{DD}$/(j+k). A person skilled in the art would know of many different circuit designs to implement the block diagram depicted in FIG. 4. The following description with reference to FIGS. 5A-5B provides one such exemplary implementation.

Figure 5A:
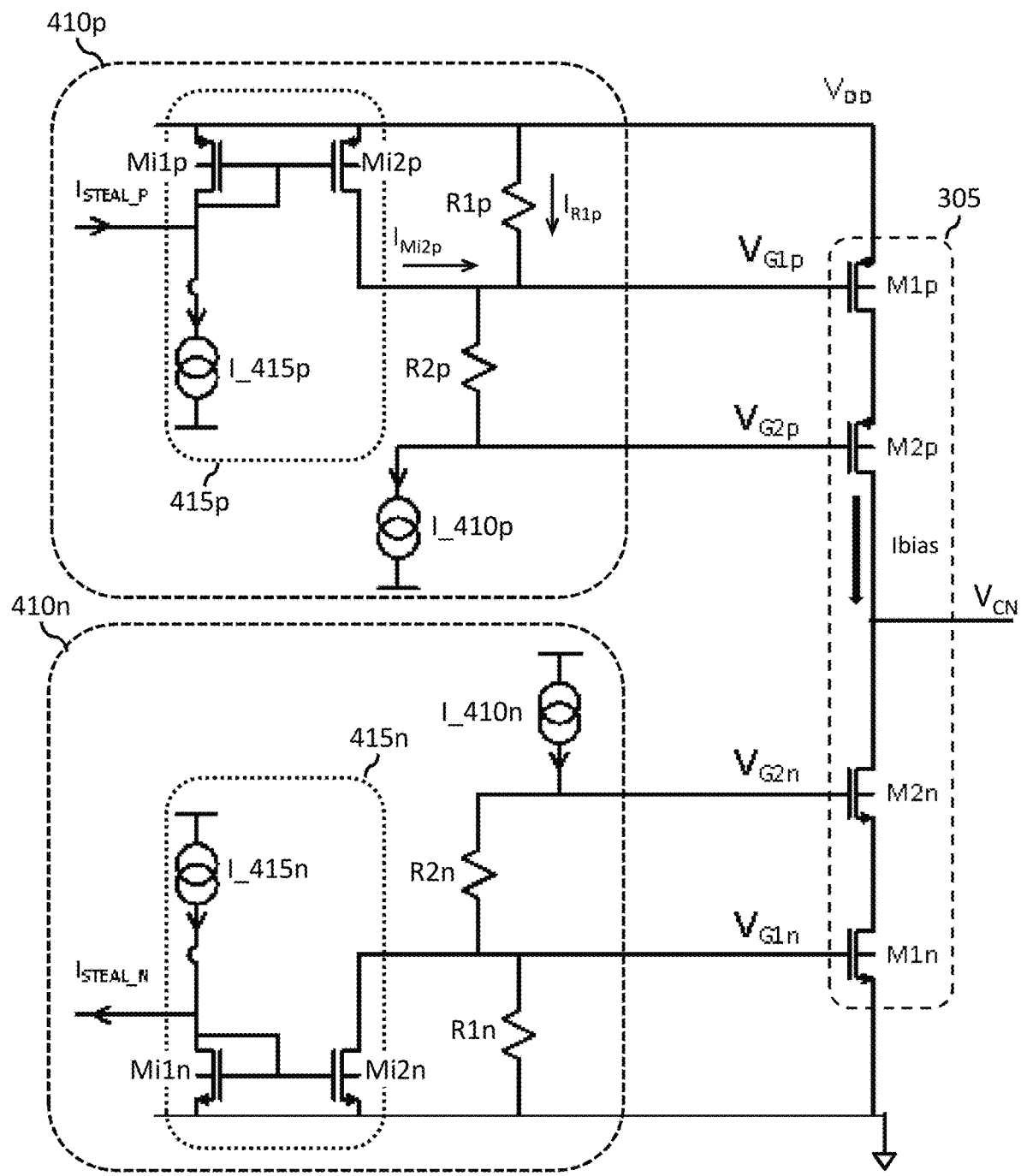
FIG. 5A shows details according to an exemplary embodiment of the present disclosure of the biasing circuit of FIG. 4, including the respective current mirror. RF connections and associated components are not shown on this diagram to aid clarity.
Figure 5B:
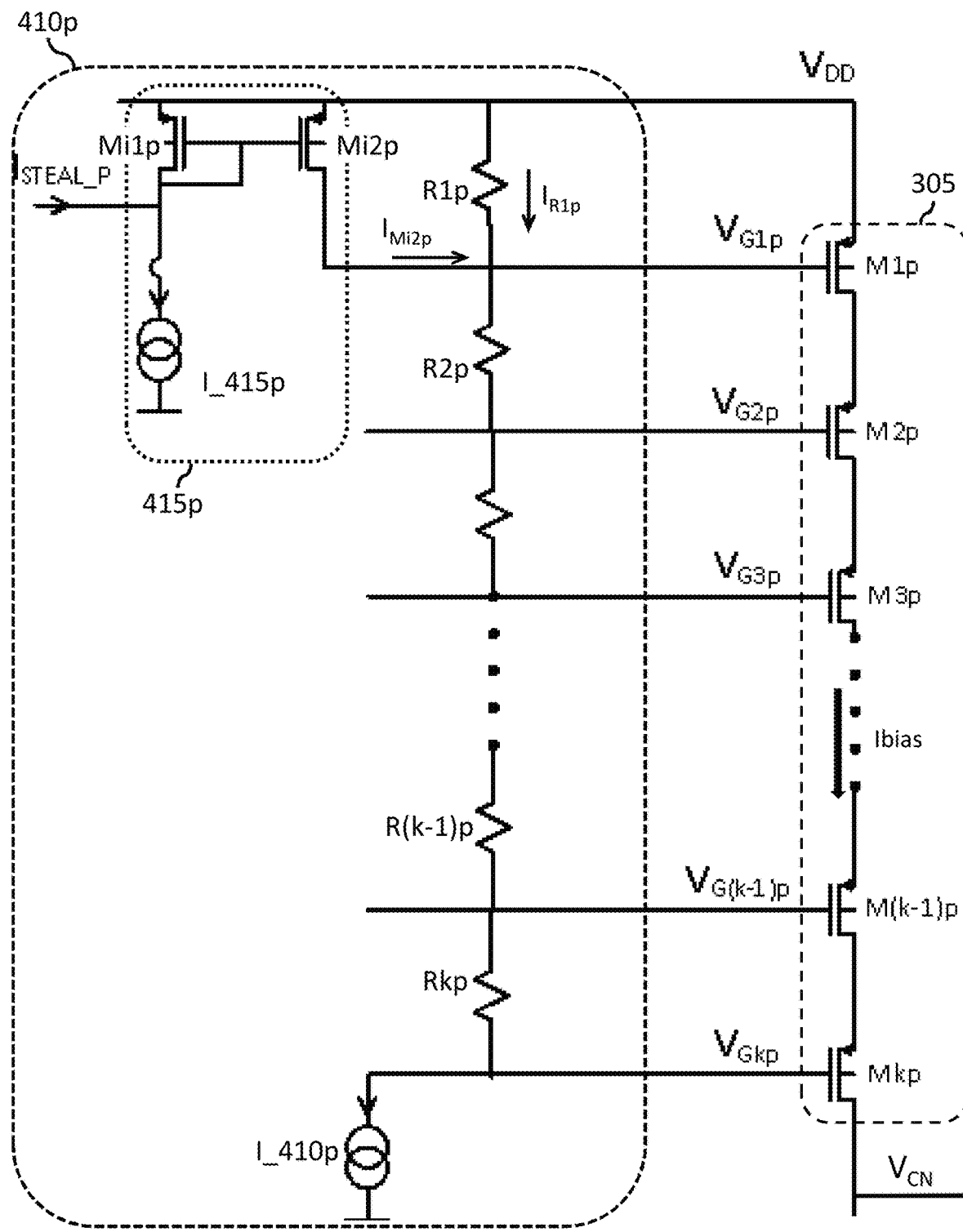
FIG. 5B shows an extension of the configuration shown in FIG. 5A for a case of a larger number of stacked transistors. Note that this figure is only showing the PMOS portion of the stacked amplifier. RF connections and associated components are not shown on this diagram to aid clarity.

FIG. 5A shows details according to an exemplary embodiment of the present disclosure of the biasing circuit of FIG. 4, including the respective N-type current mirror (415n) and P-type current mirror (415p). As can be seen in FIG. 5A, the biasing circuits (410n) and (410p) are symmetrical in topology and include similar and complementary elements, with suffixes n and p referring to elements of the respective biasing circuits (410n) and (410p). Accordingly, description of one of the two biasing circuits (410n) and (410p) may be sufficient for a person skilled in the art in understanding of the present embodiments.

With continued reference to FIG. 5A, the P-type current mirror (415p) comprises two P-type transistors Mi1p and Mi2p respectively defining a reference current path including a current source I_415p, and a mirrored current path coupled a gate node of the input transistor M1p. The current source I_415p defines a nominal current through the reference path. Control of a current through the reference path defined by the transistor Mi1p, i.e., through the reference transistor Mi1p, may be provided by sourcing (e.g., stealing) a controllable portion, $I_{STEAL\_P}$, of the current through the transistor Mi1p away from the reference path as shown in FIG. 5A. For example, if the current $I_{STEAL\_P}$=0, then the entirety of the current generated by the current source I_415p flows through the reference transistor Mi1p, and consequently, assuming a 1:1 ratio in sizes of the two transistors Mi1p and Mi2p, a same current flows through the target transistor Mi2p. On the other hand, if the current $I_{STEAL\_P}$ has a magnitude equal to or larger than the current generated by the current source I_415p, then no current flows through the target transistor Mi2p. According to an embodiment of the present disclosure, the controllable portion of current, $I_{STEAL\_P}$, is controlled based on the required Ibias current together with any small offset the error voltage, $V_{CN\_ERROR}$, described above with reference to FIG. 4 requires to maintain $V_{CN}$ at the chosen voltage.

With further reference to FIG. 5A, the biasing circuit (410p) includes a resistive ladder network (R1p, R2p) that includes series connected resistors R1p and R2p with two end nodes of the resistive ladder network respectively coupled to the supply voltage $V_{DD}$ and to a current source I_410p. Such two end nodes of the resistive ladder network (R1p, R2p) are also respectively coupled to a source node of the input transistor M1p and to a gate node of the output cascode transistor M2p. A common node of the resistive ladder network (R1p, R2p) that provides the series connection of the two resistors R1p and R2p is coupled to the gate node of the input transistor M1p and the mirrored current path of Mi2p. Accordingly, as clearly understood by a person skilled in the art, a gate biasing voltage separation (e.g., $V_{G1p}-V_{G2p}$) between a gate biasing voltage $V_{G1p}$ provided to the gate node of the input transistor M1p and a gate biasing voltage $V_{G2p}$ provided to the gate node of the output transistor M2p is equal to a voltage drop across the resistor R2p provided by the current generated by the current source I_410p. As clearly understood by a person skilled in the art, such voltage drop across the resistor R2p is independent of any current flowing through the target transistor Mi2p of the current mirror (415p). Accordingly, $V_{G2p}=V_{G1p}$−R2p*I_410p, or in other words, the combination of the resistive ladder network (Rip, R2p) with the current source I_410p is coupled to the P-type transistors M1p and M2p of the P-type stack so to provide a desired gate biasing voltage separation that per the above description, is intended to provide a desired distribution of the supply voltage $V_{DD}$ across the transistors of the stack. As described above, such separation is with respect to the gate biasing voltage $V_{G1p}$ provided to the gate of the input transistor. Accordingly, any changes to the gate biasing voltage $V_{G1p}$, whether due to a mode change (e.g., a change in required Ibias), or to an adjustment based on the error voltage, $V_{CN\_ERROR}$, are also reflected on the gate biasing voltages to the cascode transistors of the stack, including the (only) cascode transistor M2p shown in FIG. 5A, so to maintain a fixed gate biasing voltage separation.

It should be noted that although the exemplary configuration of FIG. 5A shows N-type and P-type stacks each including two stacked transistors, teachings according to the present disclosure clearly extend to stacks having any number of transistors equal to or larger than two as shown for example in FIG. 5B. As shown in FIG. 5B, considering the P-type stack of FIG. 4 having a number k of P-type transistors, a corresponding resistive ladder network per FIG. 5A may include a same number k of series connected resistors R1p, R2p, . . . , Rkp, wherein a first end node (corresponding to a first resistor R1p coupled to the supply voltage) of the resistive ladder network is coupled to the supply voltage $V_{DD}$ and to the source node of the input transistor M1p, a second end node (corresponding to a last resistor Rkp) is coupled to the current source I410_p and the gate node of the output (cascode) transistor Mkp, and (k−1) common nodes of the resistive ladder network used to provide the series connection of the resistors R1p, R2p, Rkp are respectively coupled to gate nodes of the input transistor M1p and the cascode transistors M2p, M(k−1)p. Accordingly, $V_{G2p}=V_{G1p}$−R2p*I_410p, $V_{G3p}=V_{G1p}$−(R2p+R3p)*I_410p, . . . . $V_{Gkp}=V_{G1p}$−(R2p+R3p+ . . . +Rkp)*I_410p, or in other words, the combination of the resistive ladder network (Rip, R2p, Rkp) with the current source I_410p is coupled to the P-type transistors M1p, M2p, Mkp of the P-type stack so to provide the desired gate biasing voltage separation with respect to an adjustable voltage at the gate of the input transistor M1p.

With continued reference to FIGS. 5A and 5B, a person skilled in the art would understand that a current through a branch of the resistive ladder network defined by resistors R2p, Rkp, in other words, through a branch that excludes the first resistor R1p, is constant and equal to the current generated by the current source I_410p. On the other hand, such current is also equal to a sum of currents through the target transistor Mi2p of the current mirror (415p) and a current through the resistor R1p. In other words, controlling the current through the target transistor Mi2p of the current mirror (415p) controls the current through the resistor R1p, and therefore controls the gate biasing voltage $V_{G1p}$, as $V_{G1p}=V_{DD}-I_{R1p}$ and $I_{R1p}=I\_410p-I_{Mi2p}$. For example, if $I_{Mi2p}$ is zero, then $I_{R1p}=I\_410p$ and a large drop across the resistor R1p is provided, and if $I_{Mi2p}$ is equal to I_410p, then $I_{R1p}=0$ and therefore $V_{G1p}=V_{DD}$. Accordingly, control of the gate biasing voltage $V_{G1p}$ can be provided for an OFF condition (e.g., standby mode of operation, Ibias_off) of the input transistor M1p with $I_{Mi2p}=I\_410p$ and for an ON condition (e.g., active mode of operation, Ibias_on) of the input transistor M1p with $I_{Mi2p}<I\_410p$, wherein $I_{Mi2p}$ is controlled by the $I_{STEAL\_P}$ current which is set based on the required Ibias current together with any small offset the error voltage, $V_{CN\_ERROR}$, described above with reference to FIG. 4 requires to maintain $V_{CN}$ at the chosen voltage. Although the circuit described so far can control the current in the stacked transistor amplifier (305) from an 'active mode' of bias through to 'fully OFF' whilst maintaining the desired cascode voltage relationship, further modifications are possible for saving current in OFF or standby states. A modification to add a FET switch across R1p is a simple way to set $V_{G1p}=V_{DD}$ for the 'fully OFF' condition whilst allowing I_415p and bias circuitry associated with $I_{STEAL\_P}$ later described to be switched OFF. In this case I_415p remains active and the cascode voltage relationship is maintained. Alternatively, for absolute lowest current, FET switches may be used throughout the circuit to disconnect bias circuitry as necessary and apply static voltages to key nodes for example to maintain the cascode voltage relationship. A practical implementation may include all of these features, typically with digital control to enable each configuration as required. A configuration with static voltages may be used when the circuit is fully OFF in a power saving mode, different standby mode(s) can be configured where parts of the bias circuit are running in anticipation of a request to start. Finally, a fully operational mode may be available, where the circuit may be adjusted quickly to the desired operating conditions.

With continued reference to FIGS. 5A and 5B, according to an embodiment of the present disclosure, values of the resistors (Rip, R2p, . . . ) and magnitude of the current generated by the current source I_410p may be chosen according to a desired gate biasing separation and therefore a desired distribution of the supply voltage $V_{DD}$ across transistors of each of the two N-type and P-type transistor stacks. Furthermore, magnitude of the current generated by the current source I_415p may be such that the current $I_{Mi2p}$ through the target transistor Mi2p of the current mirror (415p) can be controlled to be at least equal to the magnitude of the current generated by the current source I_410p. For example, in an exemplary case wherein a ratio is sizes of the transistors Mi1p and Mi2p is 1:1, then the magnitude of the current generated by the current source I_415p may be equal to the magnitude of the current generated by the current source I410_p.

Figure 5C:
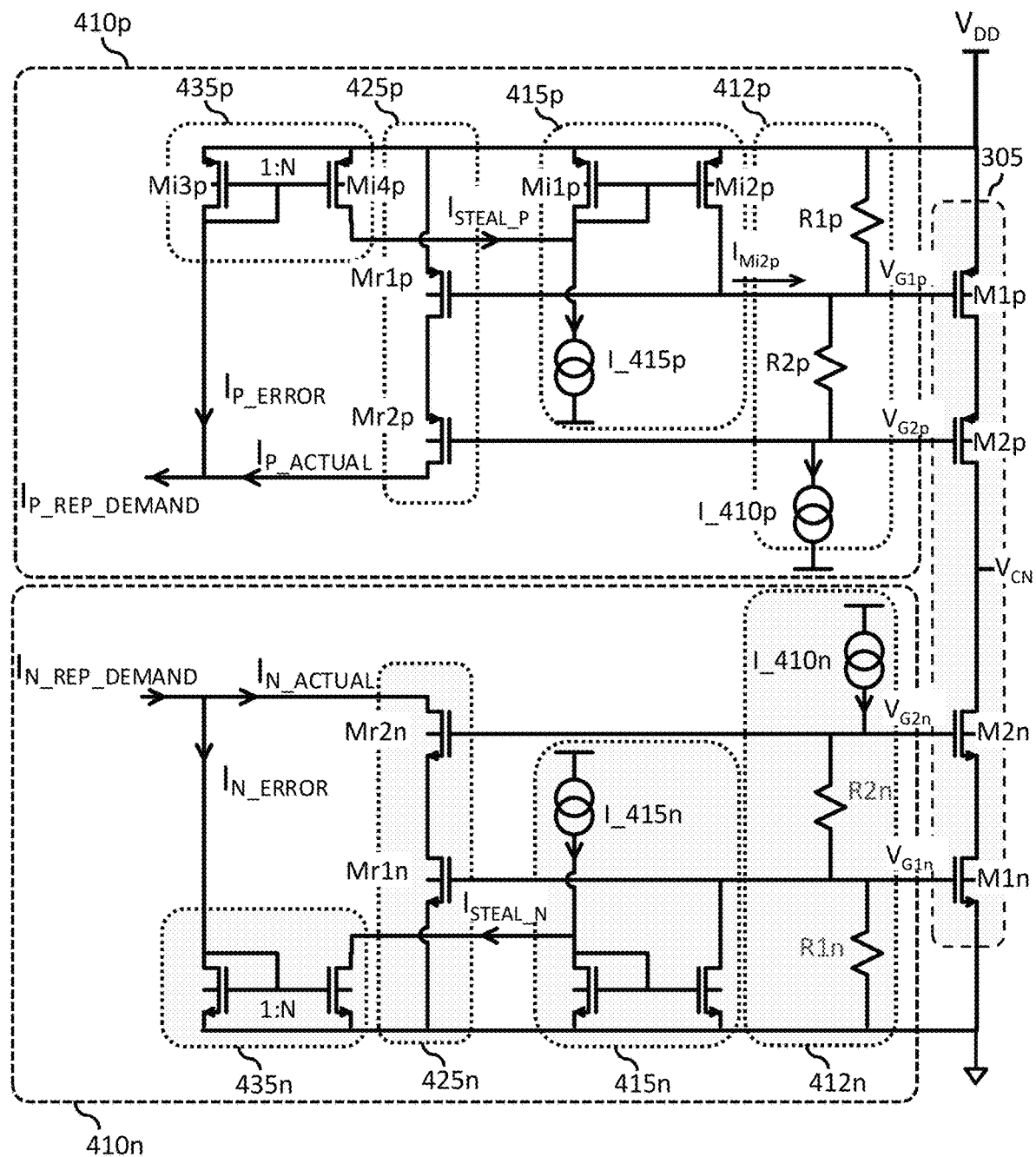
FIG. 5C shows further details according to an exemplary embodiment of the present disclosure of the biasing circuit of FIG. 5A, including respective replica circuits of each of the two series connected transistor stacks, the respective replica circuits used for measuring a current through each of the two series connected transistor stacks. RF connections and associated components are not shown on this diagram to aid clarity.

FIG. 5C shows further details according to an exemplary embodiment of the present disclosure of the biasing circuit of FIG. 5A, including respective replica circuits (425n) and (425p) of each of the two series connected transistor stacks (M1n, M2n) and (M1p, M2p), the respective replica circuits (425n, 425p) used for measuring a nominal current through each of the two series connected transistor stacks. With reference to the P-type stack (M1p, M2p), as can be seen in FIG. 5C, gate nodes of transistors Mr1p and Mr2p of the corresponding P-type replica stack (425p) are coupled to respective gate nodes of the transistors M1p and M2p, and the source node of the transistor Mr1p is coupled to the supply voltage $V_{DD}$ similarly to the source node of the input transistor M1p. In other words, the P-type replica stack (425p) is biased with same biasing voltages provided to the P-type transistor stack (M1p, M2p). Since the replica stack (425p) includes transistors Mr1p and Mr2p that are matched (but reduced size for power saving purposes with a size ratio that can be 1:N where N is equal to or larger than 100, such as 1000 or larger) to the transistors M1p and M2p of the (main) transistor stack (M1p, M2p), a current, $I_{P\_ACTUAL}$, through the replica stack (425p) represents a nominal current through the stack (M1p, M2p). It should be noted that as can be seen in FIG. 5A, and due to the above described symmetry in topology of the biasing circuit (410), a similar replica circuit (425n) that includes N-type transistors Mr1n and Mr2n is coupled to the N-type transistor stack (M1n, M2n), however, differently from the N-type and P-type transistor stacks, the two replica stacks (425n, 425p) are not coupled in series, and therefore their respective biasing conditions can be controlled independently from one another.

With continued reference to FIG. 5C, according to an embodiment of the present disclosure, a second current mirror (435p) including P-type reference transistor Mi3p and P-type target transistor Mi4p can be used to control a magnitude of the $I_{STEAL\_P}$ current that is sourced from the reference path of the current mirror (415p) described above. As can be seen in FIG. 5C, a drain node of the reference transistor of the current mirror (435p) is coupled to a drain node of the (output) transistor Mr2p of the P-type replica stack (425p) so that the current $I_{P\_ACTUAL}$ through the replica stack and a current $I_{P\_ERROR}$ through the reference transistor Mi3p of the current mirror (435p) are summed to provide a current $I_{P\_REP\_DEMAND}$. By varying the current $I_{P\_REP\_DEMAND}$, the current mirror (435p) controls the magnitude of the $I_{STEAL\_P}$ current and therefore controls the gate biasing voltage $V_{G1p}$ so to vary the current $I_{P\_ACTUAL}$ through the P-type replica stack (425p) and therefore the bias current through the transistor stack (M1p, M2p).

With further reference to FIG. 5C, by setting $I_{P\_REP\_DEMAND}$ equal to zero, both $I_{P\_ERROR}$ and $I_{P\_ACTUAL}$ become equal to zero, therefore $I_{STEAL\_P}$ is also equal to zero, and therefore as described above with reference to FIG. 5A, $I_{Mi2p}$ can be equal to the magnitude of the current generated by the current source I_410p, and therefore no current flows through the resistor R1p, and therefore the gate biasing voltage $V_{G1p}$ of the input transistor M1p and the replica transistor Mr1p is equal to the supply voltage $V_{DD}$, and therefore no current flows through the input transistor M1p and the replica transistor Mr1p. On the other hand, increasing the value of the current $I_{P\_REP\_DEMAND}$ from the zero value, the current mirror (435p) quickly increases the current $I_{STEAL\_P}$ which in turn causes a decrease in the magnitude of the current $I_{Mi2p}$ which in turn causes a non-zero current to flow through the resistor R1p causing a voltage drop across R1p and therefore gradually turning ON the transistors M1p and Mr1p, and therefore causing $I_{P\_ACTUAL}$ to increase to a non-zero value until a balance between the $I_{P\_ERROR}$ and the $I_{P\_ACTUAL}$ is reached. Accordingly, as clearly understood by a person skilled in the art, the $I_{P\_REP\_DEMAND}$ controls the current $I_{Mi2p}$ which in turn controls the gate biasing voltage $V_{G1p}$ of the input transistor M1p in a manner to increase or decrease a current $I_{P\_ACTUAL}$ through the replica stack (425p) and a current Ibias through the transistor stack (M1p, M2p).

With continued reference to FIG. 5C, according to an exemplary embodiment of the present disclosure, a ratio in sizes between the reference transistor Mi3p and the target transistor Mi4p may be selected to be 1:N, wherein N is large enough to generate a large enough magnitude of the current $I_{STEAL\_P}$ so that the current $I_{Mi2p}$ can be made equal in magnitude to the magnitude of the current generated by the current source I_410p. According to further embodiments, the value of N may be large enough such that $I_{P\_ERROR}$ is much smaller than $I_{P\_ACTUAL}$, such that $I_{P\_ACTUAL}$ has essentially the same value as $I_{P\_REP\_DEMAND}$.

Figure 5D:
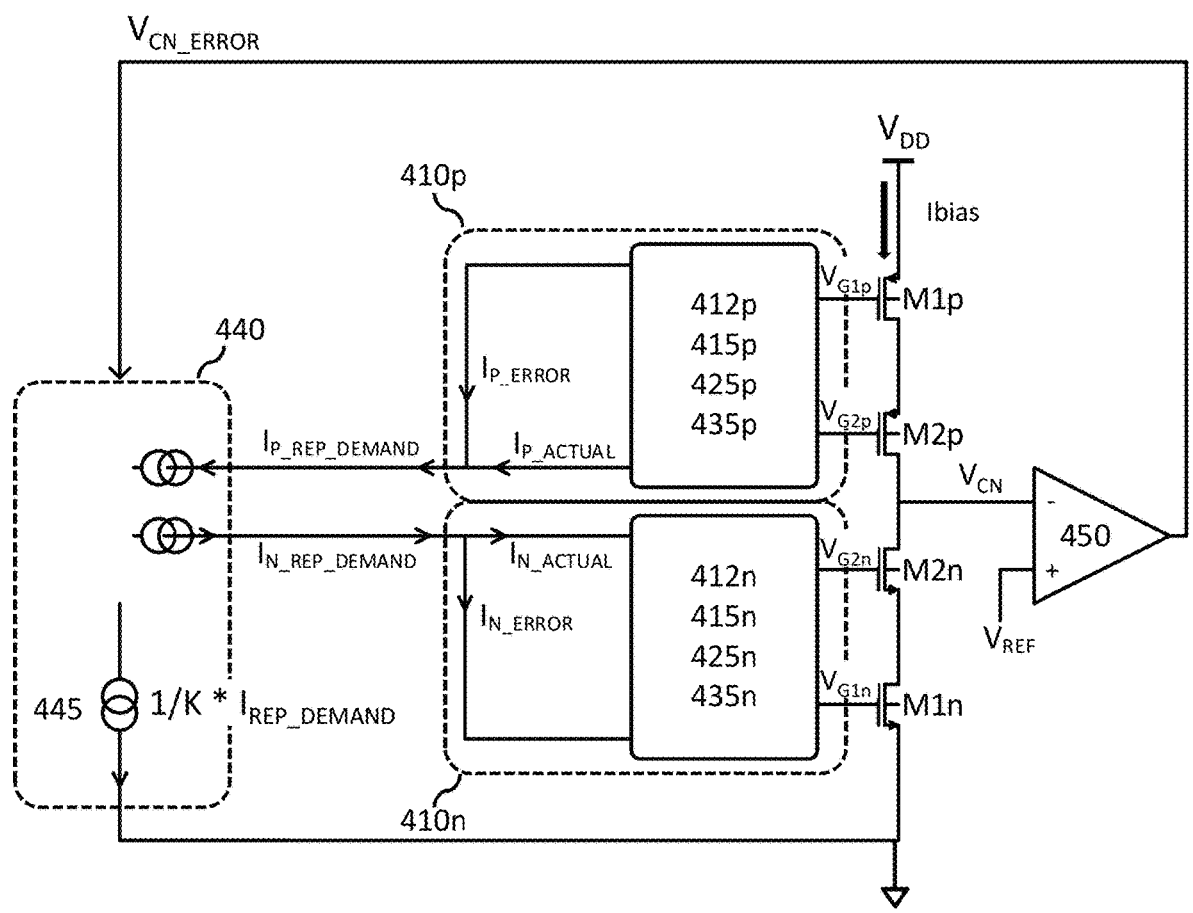
FIG. 5D shows further details according to an exemplary embodiment of the present disclosure of the biasing circuit of FIG. 5C, including a current demand distribution circuit block that generates a control current for the respective current mirror that is based on a demand current and a difference between a reference voltage and the voltage that is sensed at the common node of the two series connected transistor stacks. RF connections and associated components are not shown on this diagram to aid clarity.

FIG. 5D shows further details according to an exemplary embodiment of the present disclosure of the biasing circuit of FIG. 5C, including a current demand distribution (circuit) block (440) that generates the control current $I_{P\_REP\_DEMAND}$ described above and equivalent similar current $I_{N\_REP\_DEMAND}$, for the respective control of the current mirrors (415p) and (415n). As described above, by controlling of, for example, the current $I_{STEAL\_P}$, the current $I_{Mi2p}$ through the target transistor Mi2p of the current mirror (415p) controls the gate biasing voltage $V_{G1p}$, and therefore the current through the input transistor M1p. However, as $V_{G1p}$ is controlled, because of the fixed gate biasing voltage separation described above, and because of the coupling through the common node $V_{CN}$ of the two N-type and P-type transistor stacks, a (DC) voltage at the common node $V_{CN}$ can be controlled. A person skilled in the art would realize that such control of the voltage at the common node $V_{CN}$ may be achieved by varying any one or both of $V_{G1p}$ and $V_{G1n}$.

Figure 5E:
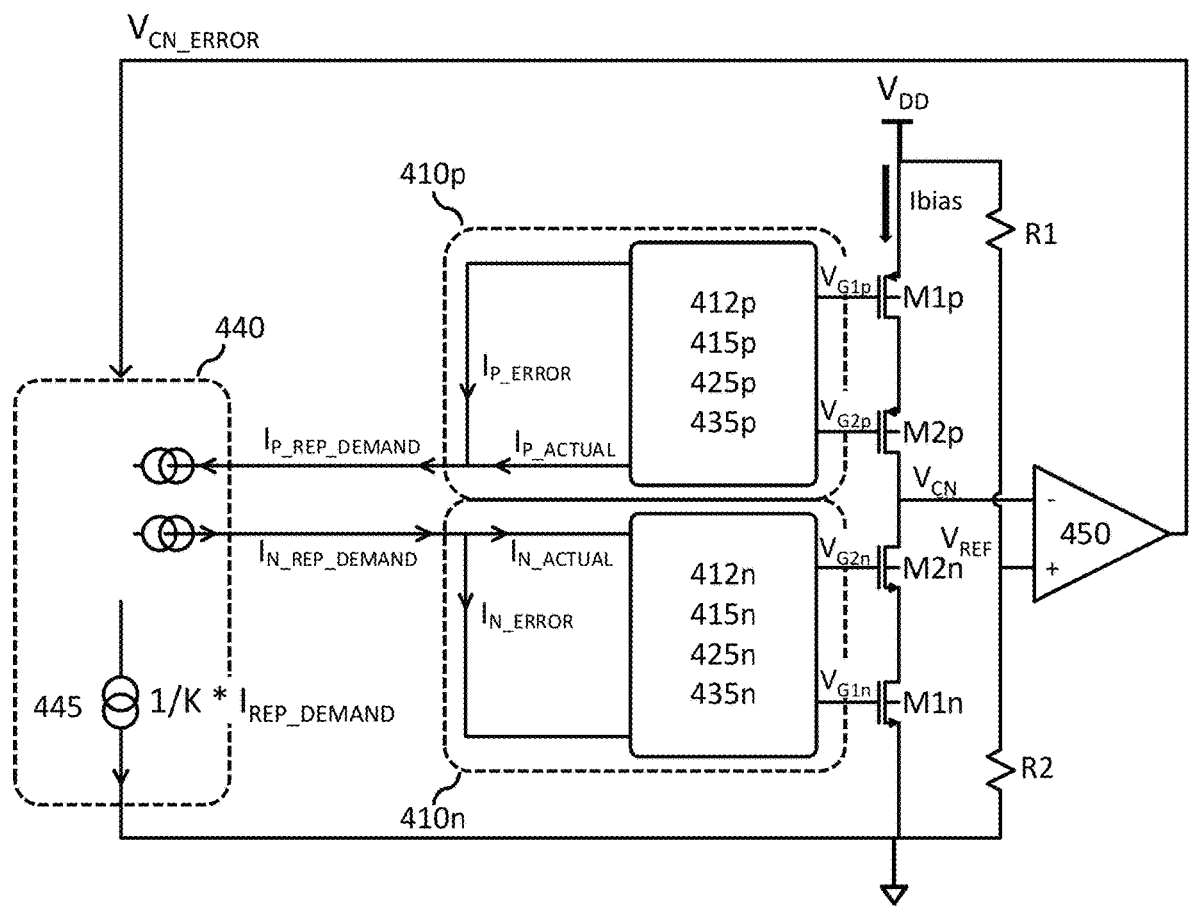
FIG. 5E shows further details according to an exemplary embodiment of the present disclosure of the biasing circuit of FIG. 5D, including a circuit to generate the reference voltage. RF connections and associated components are not shown on this diagram to aid clarity.

With continued reference to FIG. 5D, according to an embodiment of the present disclosure, the current demand distribution block (440) can adjust the control current $I_{P\_REP\_DEMAND}$ (and/or the $I_{N\_REP\_DEMAND}$) based on the error voltage, $V_{CN\_ERROR}$, that is output by the operational amplifier (450). A controllable/programmable current source (445) can generate a current $1/K*I_{REP\_DEMAND}$ that represents (fraction K of) nominal values of the currents $I_{P\_REP\_DEMAND}$ and $I_{N\_REP\_DEMAND}$ that provide a current through each of the replica stacks (425n) and (425p) representing a desired biasing current Ibias through the series connected N-type and P-type transistor stacks. In other words, without any feedback of the error voltage, $V_{CN\_ERROR}$, the current demand distribution block (440) may generate the currents $I_{P\_REP\_DEMAND}$ and $I_{N\_REP\_DEMAND}$ based on the controllable/programmable current source (445) so that the gate biasing voltages $V_{G1p}$ and $V_{G1n}$ provide a desired bias current Ibias through the series connected N-type and P-type transistor stacks. Furthermore, based on the provided error voltage, $V_{CN\_ERROR}$ and the closed loop arrangement shown in FIG. 5D, the current demand distribution block (440) may adjust any or both currents $I_{P\_REP\_DEMAND}$ and $I_{N\_REP\_DEMAND}$ so to reduce the error voltage, $V_{CN\_ERROR}$, and therefore converge the voltage at the common node $V_{CN}$ to the reference voltage Vref, whilst simultaneously providing the desired Ibias current based on the $I_{REP\_DEMAND}$ control current FIG. 5E shows further details according to an exemplary embodiment of the present disclosure of the biasing circuit of FIG. 5D, including a circuit to generate the reference voltage Vref. According to the exemplary embodiment shown in FIG. 5D, a resistive voltage divider comprising series connected resistors 121 and R2 that are coupled at respective ends of the resistive voltage divider to the supply voltage $V_{DD}$ and the reference ground. A ratio of values of the resistors 121 and R2 is selected to provide the reference voltage, Vref, at a common node of the two series connected resistors. Such reference voltage, Vref, may be chosen in view of an expected voltage value at the common node $V_{CN}$ which may in turn be based on a desired distribution of the supply voltage $V_{DD}$ across the transistors of the N-type and P-type stacks. Specific values of the resistors R1 and R2 may be selected in view of a desired limit on power consumption through such resistors. Furthermore, such resistors R1 and R2 may be programmable/variable/settable resistors to provide different ratios in view, for example, different modes of operation of the amplifier shown in FIG. 5E.

Figure 6:
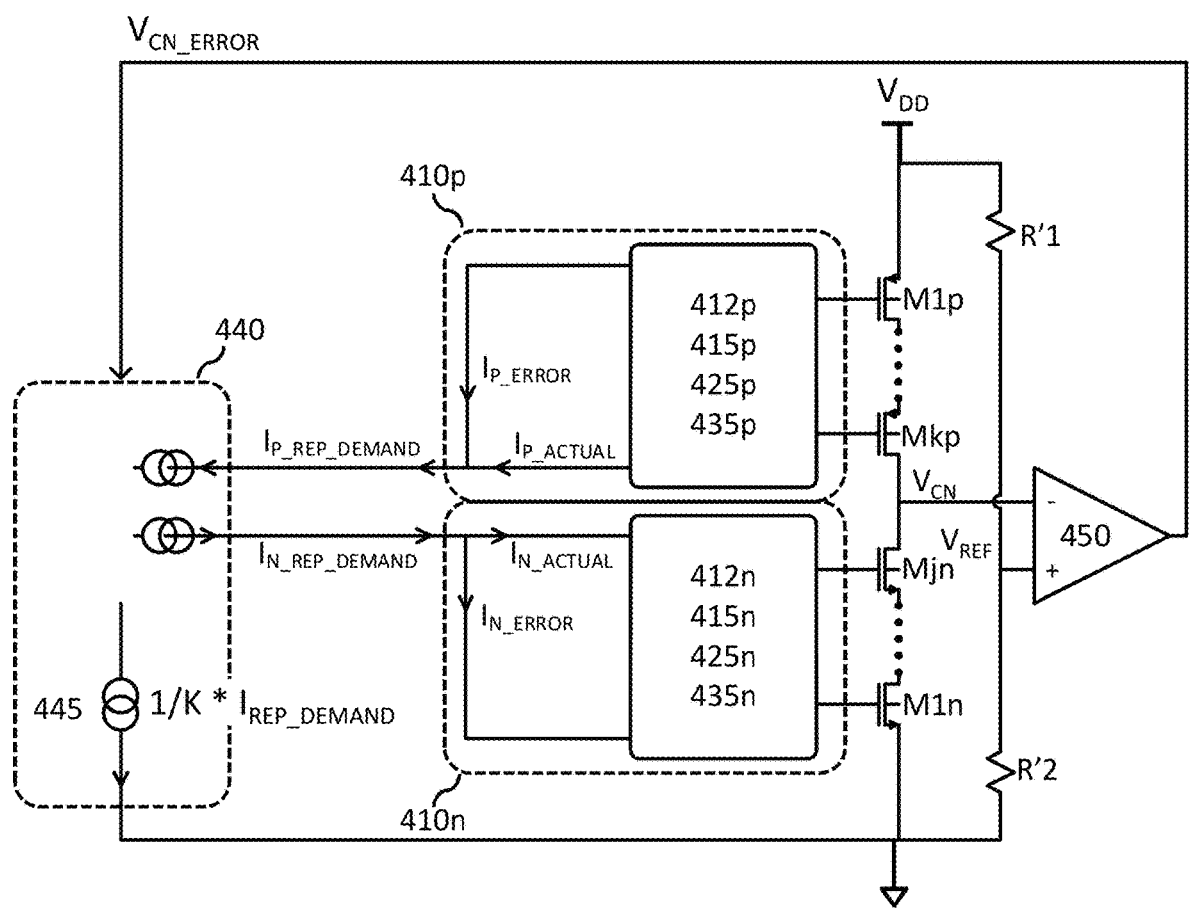
FIG. 6 shows the biasing circuit of FIG. 5E used to bias a stacked transistor amplifier comprising two series connected transistor stacks of different polarities, comprising a top stack having a plurality k of transistors of a first polarity and a bottom stack having a plurality j of transistors of a second polarity. RF connections and associated components are not shown on this diagram to aid clarity.

FIG. 6 shows the biasing circuit of FIG. 5E used to bias a stacked transistor amplifier comprising two series connected transistor stacks of different polarities, comprising a top P-type stack having a plurality k of P-type transistors (M1p, . . . , Mkp) and a bottom stack having a plurality j of N-type transistors (M1n, . . . , Mjn). Values of the resistors R'1 and R'2 may be based on an expected voltage value at the common node $V_{CN}$ in view of a desired distribution of the supply voltage $V_{DD}$ across the transistors of the N-type and P-type stacks which also takes into account a possible number j of N-type transistors that is different from a number k of P-type transistors. As described above, the biasing circuits (410n) and (410p) may be used to generate gate biasing voltages for respective N-type and P-type stacks each having any number of stacked transistors equal to or larger than two.

Figure 7:
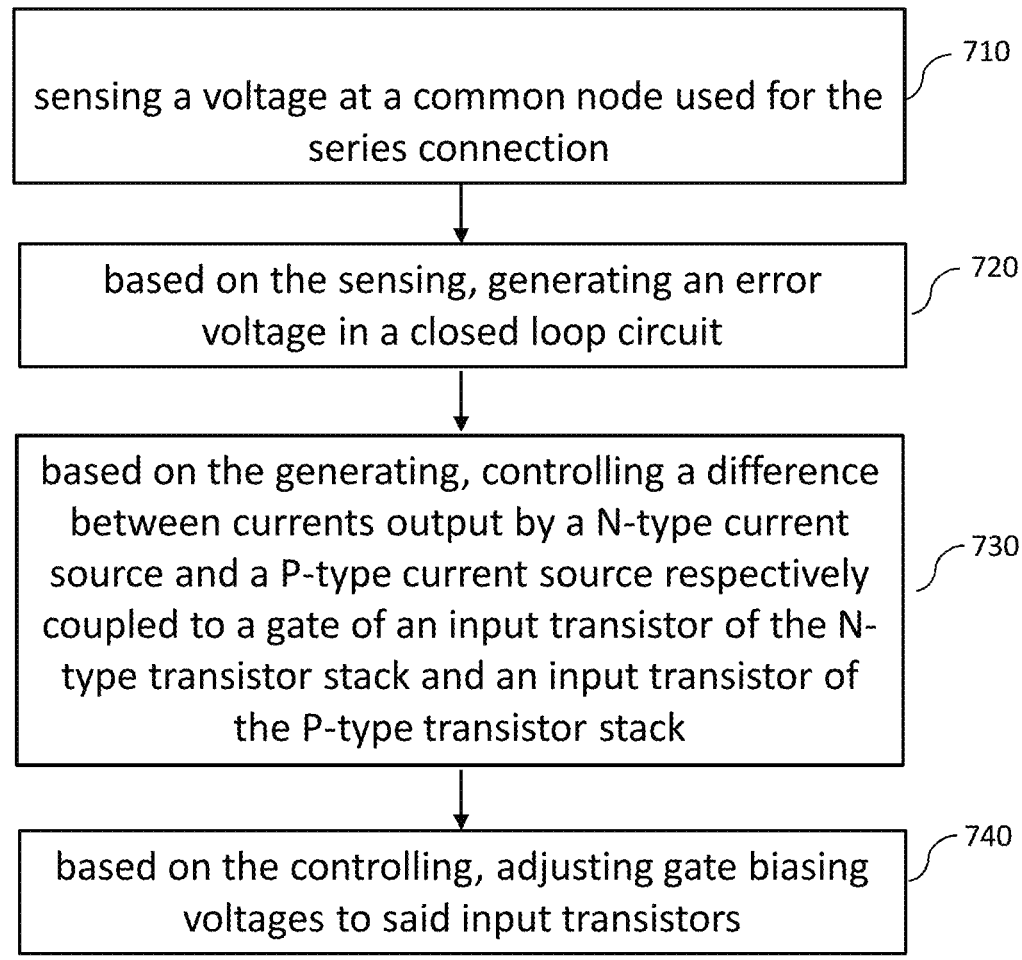
FIG. 7 is a process chart showing steps of a method for biasing a stacked transistor amplifier comprising an N-type transistor stack in series connection with a P-type transistor stack.

FIG. 7 is a process chart (700) showing various steps of a method for biasing a stacked transistor amplifier comprising an N-type transistor stack in series connection with a P-type transistor stack. As can be seen in the process chart (700), the method includes sensing a voltage at a common node used for the series connection, per step (710), based on the sensing, generating an error voltage in a closed loop circuit, per step (720), based on the generating, controlling a difference between currents output by a N-type current source and a P-type current source respectively coupled to a gate of an input transistor of the N-type transistor stack and an input transistor of the P-type transistor stack, per step (730), and based on the controlling, adjusting gate biasing voltages to said input transistors, per step (740).

It should be noted that the various embodiments of the amplifier with series connected transistor stacks of mixed polarities according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCMDA, LTE, WiFi, etc.) wherein amplification of signals with frequency content of above 100 MHz and at power levels of above 10 mW, such as, for example, above 50 mW, may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
   a stacked transistor amplifier comprising a N-type transistor stack in series connection with a P-type transistor stack, wherein the series connection is provided at a common node that couples the N-type transistor stack to the P-type transistor stack;
   a gate biasing circuit coupled to gates of a respective input transistor and respective one or more cascode transistors of each of the N-type and P-type transistor stacks to provide respective gate biasing voltages; and
   a feedback loop that is configured to use a voltage at a common node that provides the series connection to generate an error voltage,
   wherein the gate biasing circuit comprises a N-type current mirror and a P-type current mirror, and
   wherein the gate biasing circuit is configured to control a difference between respective currents output by the N-type and P-type current mirrors based on the error voltage to adjust the respective gate biasing voltages.

2. The circuital arrangement according to claim 1, wherein the N-type current mirror and the P-type current mirror are respectively coupled to the respective input transistor of the N-type transistor stack and the respective input transistor of the P-type transistor stack.

3. The circuital arrangement according to claim 1, further comprising:
   for each of the N-type and P-type transistor stacks, one or more gate capacitors each connected between a gate of a transistor of the respective one or more cascode transistors and the reference ground, wherein the each gate capacitor is configured to allow a voltage at the gate to vary along with a radio frequency (RF) voltage at a drain of the transistor.

4. The circuital arrangement according to claim 3, wherein the one or more gate capacitors are configured to substantially equalize an RF voltage at the common node across the plurality of stacked transistors.

5. The circuital arrangement according to claim 1, wherein the difference is provided by maintaining a current output by one of the N-type and P-type current mirrors fixed and adjusting the other one.

6. The circuital arrangement according to claim 1, wherein the difference is provided by adjusting the currents output by the N-type and the P-type current mirrors.

7. The circuital arrangement according to claim 1, wherein the gate biasing circuit is coupled to the gates of the respective input transistor and respective one or more cascode transistors of each of the N-type and P-type transistor stacks through a respective plurality of series connected resistors.

8. The circuital arrangement according to claim 1, wherein the stacked transistor amplifier is configured to operate as a radio frequency (RF) amplifier that amplifies an input RF signal respectively provided to the input transistor of the N-type transistor stack and of the P-type transistor stack, and provides an output RF signal at the common node that is an amplified version of the input RF signal.

9. The circuital arrangement according to claim 8, wherein the RF amplifier is configured to amplify the input RF signal with a frequency content of above 100 MHz to an amplified version of the input RF signal.

10. The circuital arrangement according to claim 9, wherein the amplified version of the input RF signal has a power level of above 10 mW.

11. The circuital arrangement according to claim 1, wherein the feedback loop comprises an operational amplifier, and
wherein the operational amplifier is configured to compare the voltage at the common node to a reference voltage to generate the error voltage.

12. The circuital arrangement according to claim 11, wherein the feedback loop further comprises two series connected resistors connected between the supply voltage and a reference ground, and
wherein a ratio of values of the two series connected resistors is configured to generate the reference voltage at a node that couples the two series connected resistors.

13. The circuital arrangement according to claim 11, wherein the reference voltage is based on a distribution of a supply voltage across the respective input transistor and respective one or more cascode transistors of each of the N-type and P-type transistor stacks.

14. The circuital arrangement according to claim 13, wherein the distribution is an even distribution of the supply voltage across said transistors.

15. The circuital arrangement according to claim 13, wherein the distribution is an uneven distribution of the supply voltage across said transistors.

16. The circuital arrangement according to claim 1, wherein for each of the N-type and P-type transistor stacks:
the gate biasing circuit further comprises a resistive ladder network comprising a plurality of series connected resistors, and a first current source in series connection with the resistive ladder network, nodes of the resistor ladder network coupled to the gates of the a respective input transistor and respective one or more cascode transistors, and
an output node of a respective one of the N-type and the P-type current mirrors is coupled to a gate of the input transistor so that a gate biasing voltage to the input transistor is based on a combination of a current provided by the first current source and the current output by said current mirror that flows through a first resistor of the plurality of series connected resistors.

17. The circuital arrangement according to claim 16, wherein for each of the N-type and P-type transistor stacks:
gate biasing voltages to the one or more cascode transistors are provided by offset voltages with respect to the gate biasing voltage to the input transistor, the offset voltages generated by a flow of the current provided by the first current source through remaining resistors of the resistive ladder network.

18. The circuital arrangement according to claim 16, wherein for each of the N-type and P-type transistor stacks:
a current that flows through the remaining resistors of the resistive ladder network is equal to the current provided by the first current source.

19. The circuital arrangement according to claim 17, wherein for each of the N-type and P-type transistor stacks:
the offset voltages provide a fixed gate biasing voltage separation between any two consecutive gate biasing voltages.

20. The circuital arrangement according to claim 1, wherein the circuital arrangement is configured to operate in at least a first mode and a second mode, and
wherein biasing of each one of the N-type and P-type transistor stacks during operation in the first mode is different from biasing of said stacks during operation in the second mode.

21. An electronic module comprising the circuital arrangement of claim 1.

22. A radio frequency (RF) front-end communication system, comprising:
a transmitter section for transmitting an RF signal according to different modes of operation, the transmitter section comprising the circuital arrangement of claim 1 configured to operate as an RF amplifier.

23. A method for biasing a stacked transistor amplifier comprising an N-type transistor stack in series connection with a P-type transistor stack, the method comprising:
sensing a voltage at a common node used for the series connection;
based on the sensing, generating an error voltage in a closed loop circuit;
based on the generating, controlling a difference between currents output by a N-type current source and a P-type current source; and
based on the controlling, adjusting gate biasing voltages to said input transistors and to each cascode transistor of the N-type transistor stack and of the P-type transistor stack.

24. The method according to claim 23, further comprising:
connecting, for each transistor of the cascode transistors of the N-type and P-type transistor stacks, a gate capacitor between a gate of the transistor and a reference ground; and
based on the connecting, varying a voltage at the gate along with a radio frequency (RF) voltage at a drain of the transistor.

* * * * *